(12) United States Patent
Kano et al.

(10) Patent No.: US 11,063,327 B2
(45) Date of Patent: Jul. 13, 2021

(54) SECONDARY BATTERY AND SECONDARY BATTERY CONTROL METHOD

(71) Applicant: Nissan Motor Co., Ltd., Yokohama (JP)

(72) Inventors: Gentaro Kano, Kanagawa (JP); Atsushi Horai, Kanagawa (JP); Kazuki Arihara, Kanagawa (JP); Hajime Satou, Kanagawa (JP); Yasuhiko Ohsawa, Kanagawa (JP); Ryoichi Senbokuya, Kanagawa (JP); Maki Chumon, Kanagawa (JP); Eiji Minegishi, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 237 days.

(21) Appl. No.: 16/484,206

(22) PCT Filed: Mar. 3, 2017

(86) PCT No.: PCT/JP2017/008610
§ 371 (c)(1),
(2) Date: Aug. 7, 2019

(87) PCT Pub. No.: WO2018/158955
PCT Pub. Date: Sep. 7, 2018

(65) Prior Publication Data
US 2020/0028145 A1 Jan. 23, 2020

(51) Int. Cl.
*H01M 50/00* (2021.01)
*H01M 50/572* (2021.01)
(Continued)

(52) U.S. Cl.
CPC .......... *H01M 50/572* (2021.01); *G01R 31/50* (2020.01); *H01M 10/04* (2013.01);
(Continued)

(58) Field of Classification Search
CPC .... H01M 10/44; H01M 10/48; H01M 50/543; H01M 10/0565; H01M 50/572; H01M 10/0585
See application file for complete search history.

(56) References Cited

U.S. PATENT DOCUMENTS

2014/0361727 A1* 12/2014 Tajima .................... H02J 1/14
320/103

FOREIGN PATENT DOCUMENTS

JP 2001-68156 A 3/2001

* cited by examiner

*Primary Examiner* — Cynthia H Kelly
*Assistant Examiner* — Monique M Wills
(74) *Attorney, Agent, or Firm* — Global IP Counselors, LLP

(57) ABSTRACT

A secondary battery is provided with a power generation element, an electroconductive member, an external short circuit, a current detector and an external discharge safety circuit. The power generation element has a unit cell layer that includes a positive electrode, a separator and a negative electrode stacked in that order. The electroconductive member is disposed on one outward side of the power generation element with an insulation member interposed therebetween. A lead wire connects the electroconductive member with the negative electrode tab. The current detector detects whether or not current is flowing to the lead wire. The external discharge safety circuit is provided to short-circuits a path between the positive electrode tab and the negative electrode tab outside the power generation element while current detector detects a current.

8 Claims, 12 Drawing Sheets

(51) Int. Cl.
*G01R 31/50* (2020.01)
*H01M 10/04* (2006.01)
*H01M 10/0565* (2010.01)
*H01M 10/0585* (2010.01)
*H01M 10/44* (2006.01)
*H01M 50/531* (2021.01)
*H01M 50/543* (2021.01)

(52) U.S. Cl.
CPC ... *H01M 10/0565* (2013.01); *H01M 10/0585* (2013.01); *H01M 10/44* (2013.01); *H01M 50/531* (2021.01); *H01M 50/543* (2021.01); *H01M 2200/00* (2013.01)

SECONDARY BATTERY AND SECONDARY BATTERY CONTROL METHOD

CROSS-REFERENCE TO RELATED APPLICATIONS

This application is a U.S. national stage application of International Application No. PCT/JP2017/008610, filed on Mar. 3, 2017.

BACKGROUND

Technical Field

The present invention relates to a secondary battery and a method for controlling a secondary battery.

Background Information

In recent years, with a rise in environmental protection movements as a background, the development of electric vehicles (EV) and hybrid electric vehicles (HEV) has been progressing. Secondary batteries and other motor-driving electric devices capable of repeatedly charging and discharging electricity are suitable as motor-driving power sources for these vehicles. There has been particular focus on lithium ion secondary batteries, with which high capacity and high output can be expected, and for which development is currently rapidly proceeding.

A lithium ion secondary battery has a structure in which, for example, a plurality of unit cell layers are stacked as a power generation element, and this stack is sealed by an exterior material. Such a lithium ion secondary battery can store a large amount of energy, and it is more vital to ensure safety.

One example of a test for ensuring safety is a nail penetration test. The premise of a nail penetration test is that a conductor will pierce and penetrate the exterior material of the secondary battery. When the conductor pierces and penetrates the exterior material of the secondary battery, short-circuiting occur between the power generation element and the conductor, and a large current flows between the power generation element interior and the conductor. At this time, Joule heat is generated and the temperature rises.

In the prior art, there is the technique of providing a short-circuit-forming/heat-release-facilitating unit in order to prevent temperature increase when such a conductor has penetrated the power generation element. The short-circuit-forming/heat-release-facilitating unit is provided outside of the battery, and an external circuit of lower resistance is therefore formed when the conductor enters the power generation element and internal short-circuiting occurs. A short-circuit current is thereby induced in the external circuit, current flowing into the conductor that has entered the power generation element is reduced, and heat generation within the power generation element is minimized. The external circuit of the short-circuit-forming/heat-release-facilitating unit is mainly a metal board, and this metal board and a lead part of electrodes within the battery are connected, whereby external short-circuiting is caused in advance of the short-circuiting within the power generation element caused by, inter alia, the entry of the conductor, battery voltage is lowered, and heat generation by chemical reaction is reduced (Japanese Laid-Open Patent Application No. 2001-68156—Patent Citation 1).

SUMMARY

However, when a conductor has entered the power generation element, heat is also generated in the part where the conductor and the short-circuit-forming/heat-release-facilitating unit connect. There is a possibility that heat in this connecting part will be transferred to the internal power generation element, the temperature within the power generation element will rise, and the battery performance will suffer. Conversely, there is also the possibility that the part where the conductor and the short-circuit-forming/heat-release-facilitating unit connect will separate, it will no longer be possible for current to be let out to the external circuit, and ultimately, current will flow into the power generation element and the temperature will rise.

The present invention was contrived in view of the circumstances described above, it being an object thereof to provide a secondary battery with which any temperature increase in a power generation element of the battery can be suppressed even when a conductor enters the power generation element. Another object of the present invention is to provide a method for controlling a secondary battery with which any temperature increase in a power generation element of the battery can be suppressed even when a conductor enters the power generation element.

The secondary battery of the present invention for achieving the aforementioned object comprises a power generation element having at least one unit cell layer including a positive electrode, a separator and a negative electrode stacked in that order. The secondary battery also comprises an electroconductive member disposed on at least one outward side of the power generation element in a direction in which the unit cell layer is stacked, an electrical insulation member being interposed between the electroconductive member and the power generation element. The secondary battery also comprises an external short circuit that electrically connects the electroconductive member to an electrode having an opposite polarity to that of an electrode in an outermost layer at the side of the power generation element where the electroconductive member is disposed. The secondary battery also comprises a current detector that detects whether or not current is flowing to the external short circuit, and the secondary battery has an external discharge safety circuit provided with an opening-closing device that electrically insulates a path between the positive electrode of the power generation element and the negative electrode of the power generation element when the current detector has not detected current, and short-circuits the path between the positive electrode of the power generation element and the negative electrode of the power generation element outside the power generation element when the current detector has detected current.

The method for controlling a secondary battery of the present invention for achieving the aforementioned object is a method for controlling a secondary battery comprising: a power generation element having at least one unit cell layer including a positive electrode, a separator and a negative electrode stacked in that order; an electroconductive member disposed on at least one outward side of the power generation element in a direction in which the unit cell layer is stacked with electrical insulation members interposed between the electroconductive members and the power generation element; and an external short circuit that respectively electrically connects the electroconductive members to electrodes having an opposite polarity to that of electrodes in outermost layers at the sides of the power generation element where the electroconductive members are disposed. In this control method, current flow to the external short circuit is detected, and the path between the positive electrode of the power generation element and the negative electrode of the power generation element is electrically short-circuited outside the power generation element.

According to the present invention, when a conductor enters the power generation element and current flowing between the electroconductive member provided to an outward side of the power generation element and an electrode to which the electroconductive member is connected is detected, the path between the positive electrode of the power generation element and the negative electrode of the power generation element is short-circuited. Due to this configuration, energy of the power generation element can be released, and any temperature increase in the power generation element can be minimized.

BRIEF DESCRIPTION OF THE DRAWINGS

FIG. 4 is a pattern diagram of a state after the nail has passed through;

FIG. 5 is a pattern diagram of another state after the nail has passed through;

FIG. 10 is a pattern diagram of a state after the nail has passed through;

FIG. 11 is a pattern diagram of another state after the nail has passed through;

DETAILED DESCRIPTION OF THE EMBODIMENTS

Figure 1:
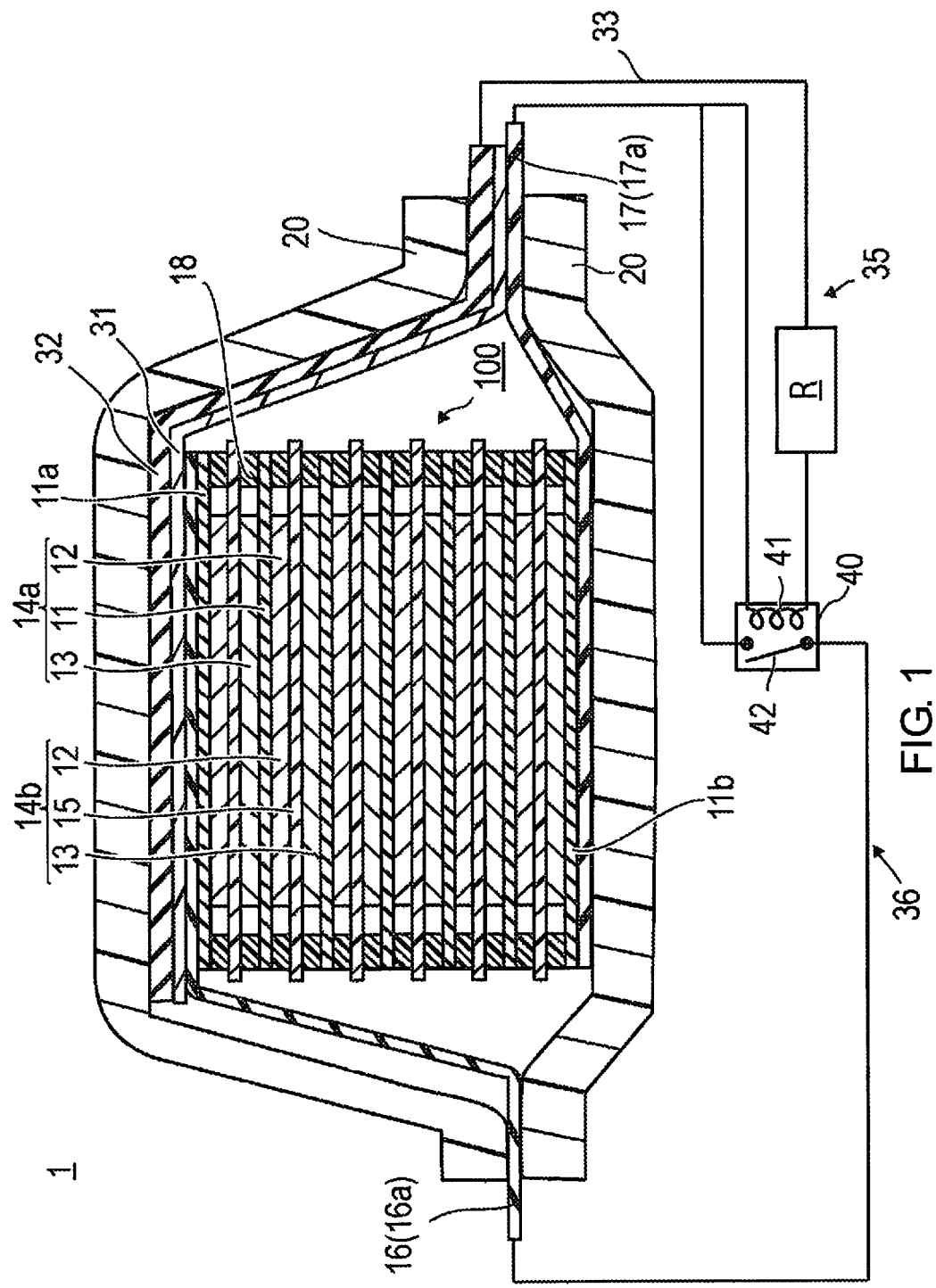
FIG. 1 is a schematic diagram of an overall structure of a bipolar secondary battery according to a first embodiment.

Embodiments of the present invention are described below with reference to the accompanying drawings. The same reference numerals are used for the same elements in the description of the drawings, and duplicate descriptions are omitted. The dimensional ratios in the drawings are emphasized for ease of description and may be different from actual ratios. In the description below, the term "electrically connected" includes both cases in which an electrical member (component) is directly connected and brought into electrical continuity, and cases in which another electroconductive member (e.g., a resistance element, a load, a coil, etc.) is interposed partway along and brought into electrical continuity.

First Embodiment

A first embodiment is a bipolar secondary battery.

FIG. 1 is a schematic diagram of an overall structure of the bipolar secondary battery according to the first embodiment.

As shown in FIG. 1, a bipolar secondary battery 1 has a structure in which a power generation element 100 that performs charging and discharging is sealed within an exterior material 20.

In the power generation element 100, a plurality of bipolar electrodes 14a are stacked with separators 15 interposed therebetween, each of the bipolar electrodes 14a having a positive electrode 12 formed on one surface of a planar collector 11 and a negative electrode 13 formed on another surface of the collector 11. Therefore, the power generation element 100 is a structure in which several unit cell layers 14b are stacked with the collectors 11 interposed therebetween, each of the unit cell layers 14b being comprised of a separator 15, a positive electrode 12 positioned on one surface of the separator 15, and a negative electrode 13 positioned on another surface of the separator 15. In the bipolar secondary battery 1, the unit cell layers 14b are stacked with the collectors 11 interposed therebetween so that the positive electrodes 12 and the negative electrodes 13 alternate, whereby the unit cell layers 14b are electrically connected in series. The number of the unit cell layers 14b that are stacked is not limited, and can be adjusted in accordance with a desired output voltage.

Of the plurality of the collectors 11, an outermost-layer collector on a positive-electrode side of the bipolar secondary battery 1 is differentiated as a positive-electrode-side outermost-layer collector 11a, and an outermost-layer collector on a negative-electrode side 1 is differentiated as a negative-electrode-side outermost-layer collector 11b.

The positive-electrode-side outermost-layer collector 11a is joined to a positive electrode collector board 16. The negative-electrode-side outermost-layer collector 11b is joined to a negative electrode collector board 17. This configuration is not provided by way of limitation; the positive-electrode-side outermost-layer collector 11a and the negative-electrode-side outermost-layer collector 11b may be joined to the positive electrode collector board 16 and the negative electrode collector board 17 with a respective predetermined layer (e.g., a layer constituting a positive electrode or a negative electrode) interposed therebetween.

The positive electrode collector board 16 is electrically connected to the power generation element 100 in one outermost layer of the power generation element 100, and part of the positive electrode collector board 16 is led unchanged out of the exterior material 20, where this part becomes a positive electrode tab 16a. The positive electrode tab 16a is a positive electrode of the power generation element 100.

The negative electrode collector board 17 is electrically connected to the power generation element 100 in another outermost layer of the power generation element 100, and a part of the negative electrode collector board 17 is led unchanged out of the exterior material 20, where this part becomes a negative electrode tab 17a. The negative electrode tab 17a is a negative electrode of the power generation element 100.

When the bipolar secondary battery 1 is discharging electricity, external loads are connected to the positive electrode tab 16a and the negative electrode tab 17a, and when the battery is charging, chargers (including a generator) are connected. A motor and other circuits, etc., are examples of the external loads. One electrode (the positive electrode tab 16a or the negative electrode tab 17a) of the bipolar secondary battery 1 is grounded (connected to earth) through these external loads and chargers.

There are no particular limitations on the collectors 11, 11a, 11b, the positive electrode collector board 16, and the negative electrode collector board 17, as long as such are electroconductive materials used in a secondary battery. Specific examples that can be used include aluminum, steel, nickel, alloys thereof, stainless steel, and other metals, as well as electroconductive resins, etc.

The power generation element 100 has several seal parts 18 in contact with outer peripheral edges of the collectors 11. The seal parts 18 are formed by an insulating seal material. The seal parts 18 are secured to end parts at the outer peripheries of the collectors 11, and each of the seal parts is disposed between two separators 15. The seal parts 18 prevent contact between adjacent collectors 11 in the power generation element 100, and short-circuiting caused by slight unevenness in end parts of the unit cell layers 14b.

An electroconductive member 32 is stacked outward from the positive electrode collector board 16 in the direction in which the unit cell layers 14b are stacked, with an electric insulation member (referred to simply below as an insulation member) 31 interposed between the positive electrode collector board 16 and the electroconductive member 32. The insulation member 31 prevents contact between the positive electrode collector board 16 and the electroconductive member 32 and electrically insulates the two members from each other.

The electroconductive member 32 is electrically connected to an electrode having an opposite polarity to of that of the electrode in the outermost layer at the side of the power generation element 100 where the electroconductive member 32 is disposed. The electroconductive member 32 is disposed on an outward side of the positive-electrode-side outermost-layer collector 11a with the insulation member 31 therebetween. Therefore, the electroconductive member 32 is electrically connected to the negative electrode tab 17a, which is the negative electrode of the power generation element 100.

One end of the electroconductive member 32 is led out of the exterior material 20 and is electrically connected to the negative electrode tab 17a (the negative electrode of the power generation element 100) by a lead wire 33. A resistor R and a coil 41 of a relay 40 are connected partway along the lead wire 33. In other words, the electroconductive member 32 is connected to one terminal of the coil 41 via the resistor R, and another terminal of the coil 41 is connected to the negative electrode tab 17a. In this embodiment, the pathway through the lead wire 33 along the electroconductive member 32, the resistor R, the coil 41, and the negative electrode tab 17a is referred to as an external short circuit 35.

In the external short circuit 35, the electroconductive member 32 is electrically connected to the negative electrode tab 17a, and is electrically insulated from the positive electrode collector board 16 by the insulation member 31. Therefore, in a normal state (the state shown in FIG. 1), current does not flow to the coil 41 and the resistor R.

The resistor R is a load for protecting the relay 40 (particularly the coil) when current flows to the external short circuit 35 (described hereinafter). Attaching the resistor R has the action of enabling current to flow more easily to an external discharge safety circuit 36 when current flows to the external short circuit 35 (the details will be described hereinafter). Current flows to the external short circuit 35 when the electroconductive member 32 is pierced and a conductor has entered. Contact resistance between the entered conductor and the electroconductive member 32 is higher than normal wiring resistance. Therefore, even without the resistor R, current would flow more easily to the external discharge safety circuit 36 than to the external short circuit 35. Therefore, the resistor R may be omitted if the relay 40 has sufficient voltage resistance.

The electroconductive member 32 has an area equal to or greater than an area of the electrodes (an area of a surface intersecting a stacking direction of the power generation element). This area is essentially an area equal to or greater than whichever of the positive electrode collector board 16 and the negative electrode collector board 17 is larger. Due to the electroconductive member 32 being this size, a conductor (e.g., a nail of a nail penetration test) would definitely come into contact with the electroconductive member 32 if the conductor were to enter the power generation element 100.

The electroconductive member 32 is preferably a conductive material, as with the collector or the collector boards; for example, a metal or an electroconductive resin can be used.

The material used for the insulation member 31 has the properties of, inter alia, insulation, sealing (sealability) to prevent a solid electrolyte from falling out, sealing to prevent external moisture from permeating, and heat resistance at or below an operating temperature of the battery. For example, a urethane resin, an epoxy resin, a polyethylene resin, a polypropylene resin, a polyimide resin, rubber, etc., is used. It is particularly preferable to use a urethane resin or an epoxy resin from standpoints of corrosion resistance, chemical resistance, ease of production (membrane formability), economic efficiency, etc.

The relay 40 is well known and comprises the coil 41 and a switch 42, and the switch 42 is opened and closed by electromagnetic force generated in the coil 41 due to current flowing to the coil 41. The coil 41 is normally wound around an iron core (not shown), but there are coils with which an iron core is not involved. The coil 41 is a current detector, and the switch 42 is an opening-closing device.

In the relay 40, one terminal of the switch 42 is connected to the positive electrode tab 16a, and another terminal is connected to the negative electrode tab 17a. The switch 42 is constantly open (OFF), and is attached so as to be actuated to closed (ON) due to current flowing to the coil 41.

The relay 40 used in the first embodiment is, for example, a bistable relay (latching relay). When current flows to the coil 41 and the switch 42 changes, the bistable relay preserves the state subsequent to the change even if the current of the coil 41 is cut off (there is no return to the original state even if the coil current is cut off). In the first embodiment, the switch 42 in an open (OFF) state electrically insulates the negative electrode tab 17a from the positive electrode tab 16a in a state in which current does not flow to the coil 41. When current flows to the coil 41, the switch 42 closes (ON) and electrically connects the negative electrode tab 17a to the positive electrode tab 16a. Once the switch 42 has closed (ON), the switch 42 remains in a closed state even if current ceases to flow to the coil 41. Therefore, the state in which the negative electrode tab 17a is electrically connected to the positive electrode tab 16a is maintained. A relay other than a bistable relay can be used; it is possible to use a relay, magnet switch, electromagnetic opening-closing device, etc., with which the pathway between the positive electrode tab 16a and the negative electrode tab 17a is open (OFF) when electricity is not conducted to the coil and is closed (ON) when electricity is conducted to the coil, and the pathway does not revert back thereafter.

The pathway in which outside of the power generation element 100 (outside of the exterior material), the positive electrode tab 16a and the negative electrode tab 17a are electrically connected by this relay 40, is referred to as the external discharge safety circuit 36.

The other components of the power generation element are described below.

The positive electrodes 12 constitute positive electrode active material layers. The positive electrodes 12 each include a positive electrode active material, an electroconductivity auxiliary, etc. The positive electrodes 12 are in sheet form having a prescribed thickness t1.

The positive electrode active material is a positive electrode material that can accumulate and release matter (ions) moving back and forth between the positive electrodes 12 and the negative electrodes 13 in an electrode reaction. Examples of the positive electrode active material include composite oxides of lithium and a transition metal (e.g., $LiCoO_2$, $LiNiO_2$, $LiMnO_2$, and $LiMn_2O_4$), transition metal sulfides (e.g., $MoS_2$ and $TiS_2$), electroconductive polymers (e.g., polyaniline, polyvinylidene fluoride, polypyrrole, polythiophene, polyacetylene, poly-p-phenylene, and polycarbazole), etc.

The electroconductivity auxiliary is selected from an electroconductive material. The electroconductivity auxiliary is, for example: aluminum, stainless steel (SUS), silver, gold, copper, titanium, or another metal; graphite, carbon black, or another form of carbon; or a mixture of these examples.

The negative electrodes 13 constitute negative electrode active material layers. The negative electrodes 13 each include a negative electrode active material, an electroconductivity auxiliary, etc. The negative electrodes 13 are in sheet form having a prescribed thickness t2.

The negative electrode active material is a negative electrode material that can accumulate and release matter (ions) moving back and forth between the positive electrodes 12 and the negative electrodes 13 in an electrode reaction. Examples of the negative electrode active material include graphite, nongraphitizing carbon, amorphous carbon, a calcine of a polymeric compound (e.g., a phenol resin, a furan resin, etc., calcinated and carbonized), cokes (e.g., pitch coke, needle coke, and petroleum coke), carbon fibers, electroconductive polymers (e.g., polyacetylene and polypyrrole), tin, silicon, metal alloys (e.g., lithium-tin alloys, lithium-silicon alloys, lithium-aluminum alloys, and lithium-aluminum-manganese alloys), composite oxides of lithium and a transition metal (e.g., $Ti_4Ti_5O_{12}$), etc.

The thickness t1 of the positive electrodes 12 and the thickness t2 of the negative electrodes 13 are both preferably 150 to 1500 μm. Ensuring the thickness of the positive electrodes 12 and the negative electrodes 13 is high makes it possible for much active material to be contained within the battery and for the battery to be high capacity, and is effective in improving energy density.

These examples are not provided as limitations on the positive electrode active material and the negative electrode active material; materials used in normal secondary batteries can be used. The separators 15 are provided between the positive electrodes 12 and the negative electrodes 13, and the separators keep the positive electrodes 12 and the negative electrodes 13 electrically separated. The separators 15 preserve an electrolytic solution between the positive electrodes 12 and the negative electrodes 13 and ensure ion conductance.

Possible examples of the form of the separators 15 include porous membrane (porous sheet) separators, nonwoven fabric separators, etc., including a polymer or a fiber that absorbs and preserves an electrolyte (an electrolytic solution).

For example, a microporous substance (a microporous membrane) can be used as porous membrane separators 15 including a polymer or a fiber. Possible examples of the specific form of the porous membrane including a polymer or a fiber include microporous substances (microporous membranes) including, for example: polyethylene (PE), polypropylene (PP), and other polyolefins; a layered form of a plurality of these polyolefins (e.g., a layered form having a PP/PE/PP three-layer structure, etc.); polyimide, amide, polyvinylidene fluoride-hexafluoropropylene (PVdF-HFP), and other hydrocarbon resins; glass fibers; etc.

The thickness of a microporous substance (microporous membrane) separator differs depending on the use and therefore cannot be unambiguously stipulated. To give one example, the thickness in a single layer or multiple layers is preferably 4 to 60 μm in an application such as a secondary battery for driving a motor in an electric vehicle (EV), a hybrid electric vehicle (EV), a fuel cell vehicle (FCV), etc. A micropore diameter in a microporous substance (microporous membrane) separator is preferably at most 1μm or less (normally a pore diameter of about several dozen nanometers).

A nonwoven fabric separator can be one or a mixture of the following: cotton; rayon; acetate; nylon; polyester; PP, PE, or another polyolefin; polyimides; aramids; or another conventionally known material. A bulk density of the nonwoven fabric preferably has sufficient battery properties due to a polymeric gel electrolyte with which the fabric is impregnated, and there should not be any particular limitations on the bulk density. Furthermore, the thickness of a nonwoven fabric separator is preferably 5 to 200 μm, and more preferably 10 to 100 μm.

The separators 15 are preferably separators in which a heat-resistant insulating layer is stacked on a porous membrane or another base (separators with heat-resistant insulating layers). The heat-resistant insulating layers are ceramic layers containing inorganic particles and a binder. The separators with heat-resistant insulating layers have high heat resistance with a melting point or softening point of 150° C. or greater and preferably 200° C. or greater. Due to the presence of the heat-resistant insulating layers, an effect of minimizing thermal contraction is achieved because internal stress is alleviated in the separators which enlarge when the temperature increases.

The inorganic particles in the heat-resistant insulating layers contribute to mechanical strength and the effect of minimizing thermal contraction of the heat-resistant insulating layers. There are no particular limitations on the material used as the inorganic particles. Some possible examples include: oxides of silicon, aluminum, zirconium, and titanium ($SiO_2$, $Al_2O_3$, $ZrO_2$, $TiO_2$); hydroxides; nitrides; and composites thereof. These inorganic particles may be derived from boehmite, zeolite, apatite, kaolin, mullite, spinel, olivine, mica, or another mineral resource, or the particles may be artificially produced. One of these types of inorganic particles may be used alone, or two or more types may be used together. Of these examples, from a cost standpoint, it is preferable to use silica ($SiO_2$) or alumina ($Al_2O_3$), and it is more preferable to use alumina ($Al_2O_3$).

A basis weight of heat-resistant particles is not particularly limited, and is preferably 5 to 15 g/m². This range is preferable because sufficient ion conductance is achieved and heat-resistant strength is maintained.

The binder in the heat-resistant insulating layers has the role of binding inorganic particles to each other or binding together inorganic particles and a base of a resin porous membrane, etc. Due to the binder, the heat-resistant insulating layers are formed in a stable manner, and peeling between the base of the porous substance, etc., and the heat-resistant insulating layers is prevented.

There are no particular limitations on the binder used in the heat-resistant insulating layers; for example, carboxymethylcellulose (CMC), polyacrylonitrile, cellulose, an ethylene-vinyl acetate copolymer, polyvinyl chloride, styrene-butadiene rubber (SBR), isoprene rubber, butadiene rubber, polyvinylidene fluoride (PVDF), polytetrafluoroethylene (PTFE), polyvinyl fluoride (PVF), methyl acrylate, and other compounds can be used as the binder. Of these examples, it is preferable to use carboxymethylcellulose (CMC), methyl acrylate, or polyvinylidene fluoride (PVDF). One of these compounds may be used alone, or two or more may be used together.

The binder content of the heat-resistant insulating layers is preferably 2 to 20 wt % per 100 wt % of the heat-resistant insulating layers. When the binder content is 2 wt % or greater, peeling strength between the heat-resistant insulating layers and the porous base layers can be increased, and vibration resistance of the separators can be improved. When the binder content is 20 wt % or less, gaps between inorganic particles are preserved to an appropriate degree, and sufficient lithium ion conductance can be ensured.

The electrolyte (electrolytic solution) is a non-aqueous (based) electrolytic solution. Ions move between the positive electrodes 12 and the negative electrodes 13 via the electrolytic solution, whereby electricity of the power generation element 100 is charged and discharged. For example, the electrolytic solution is lithium salt, etc., which is a support salt, dissolved in an organic solvent. Possible examples include: (1) propylene carbonate, ethylene carbonate, and other annular carbonates; (2) dimethyl carbonate, methylethyl carbonate, diethyl carbonate, and other chain carbonates; (3) tetrahydrofuran, 2-methyl tetrahydrofuran, 1,4-dioxane, 1,2-dimethoxyethane, 1,2-dibutoxyethane, and other ethers; (4) γ-butyrolactone and other lactones; (5) acetonitrile and other nitriles; (6) methyl propionate and other esters; (7) dimethyl formamide and other amides; (8) aprotic solvents and other plasticizers in which one, two, or more selected from methyl acetate and methyl formate are mixed; etc. One of these organic solvents may be used alone, or two or more may be used in combination. A conventionally known salt can be used as the support salt. For example, $Li(C_2F_5SO_2)_2N(LiBETI)$, $Li(CF_3SO_2)_2N(LiTFSI)$, $Li(FSO_2)_2N(LiFSI)$, $LiPF_6$, $LiBF_4$, $LiClO_4$, $LiAsF_6$, $LiCF_3SO_3$, $Li(CF_3SO_2)_2N$, $Li(C_2F_5SO_2)_2N$, etc. is used.

The exterior material 20 covers and seals the power generation element 100 from both sides. The exterior material 20 thereby accommodates the power generation element 100. For example, a laminate film having a three-layer structure of resin-aluminum-resin, etc., is used as the exterior material 20.

In the first embodiment, the electroconductive member 32 is provided to an outward side of the positive electrode collector board 16, but can instead be provided to an outward side of the negative electrode collector board 17 with the insulation member 31 interposed therebetween. In this case, the electroconductive member 32 is electrically connected to the positive electrode tab 16a (a positive electrode of the power generation element 100) by the lead wire 33.

Actions

The actions of the bipolar secondary battery 1 according to the first embodiment shall be described, using a nail penetration test as an example. A nail penetration test is a safety test that assumes a case in which a conductor penetrates the exterior material of the secondary battery and reaches the power generation element, as is well known.

Figure 2:
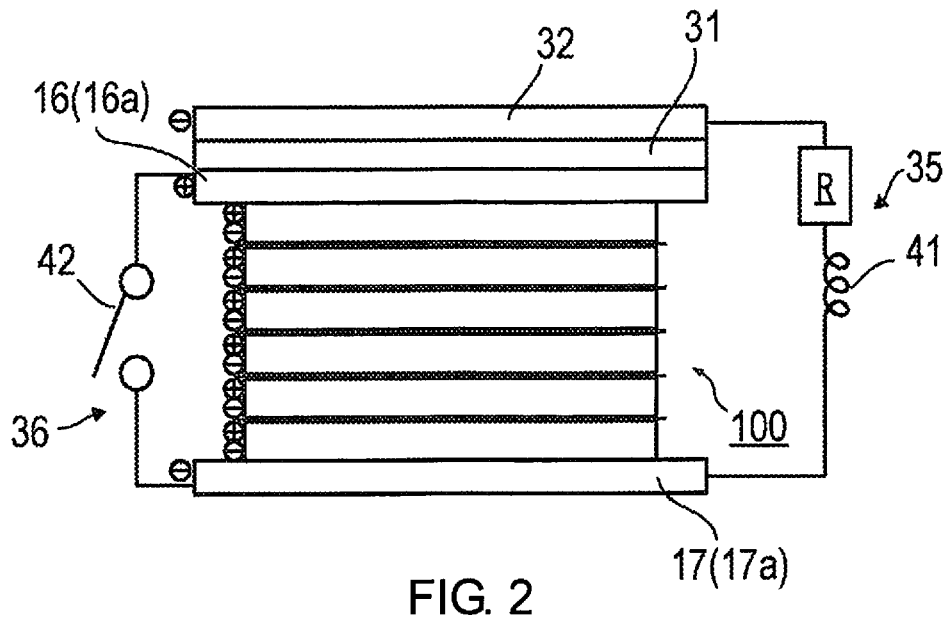
FIG. 2 is a pattern diagram of a state before nail penetration.
Figure 3:
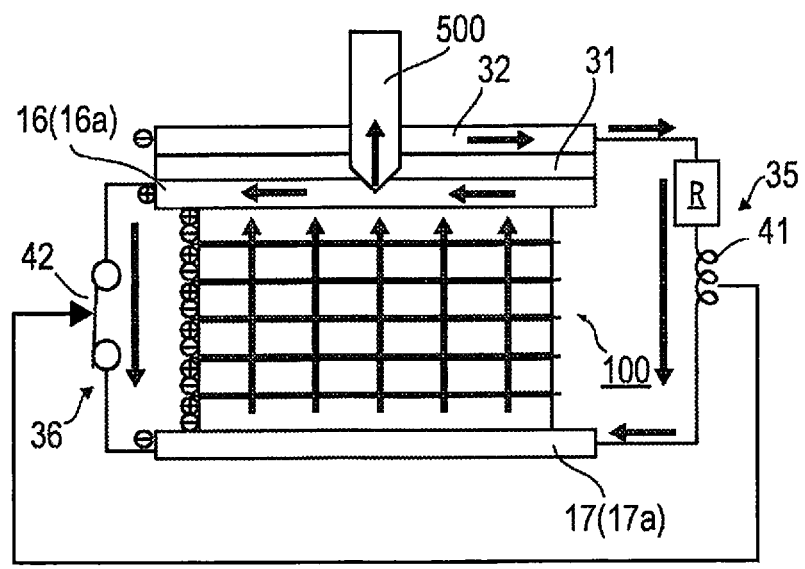
FIG. 3 is a pattern diagram of a state after nail penetration.
Figure 4:
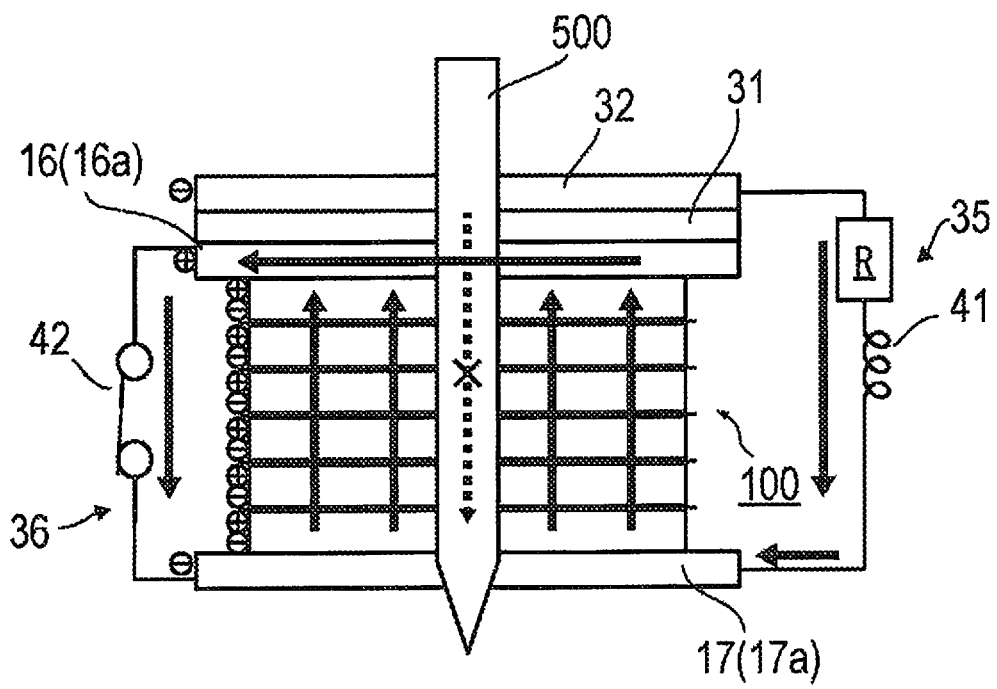
Figure 5:
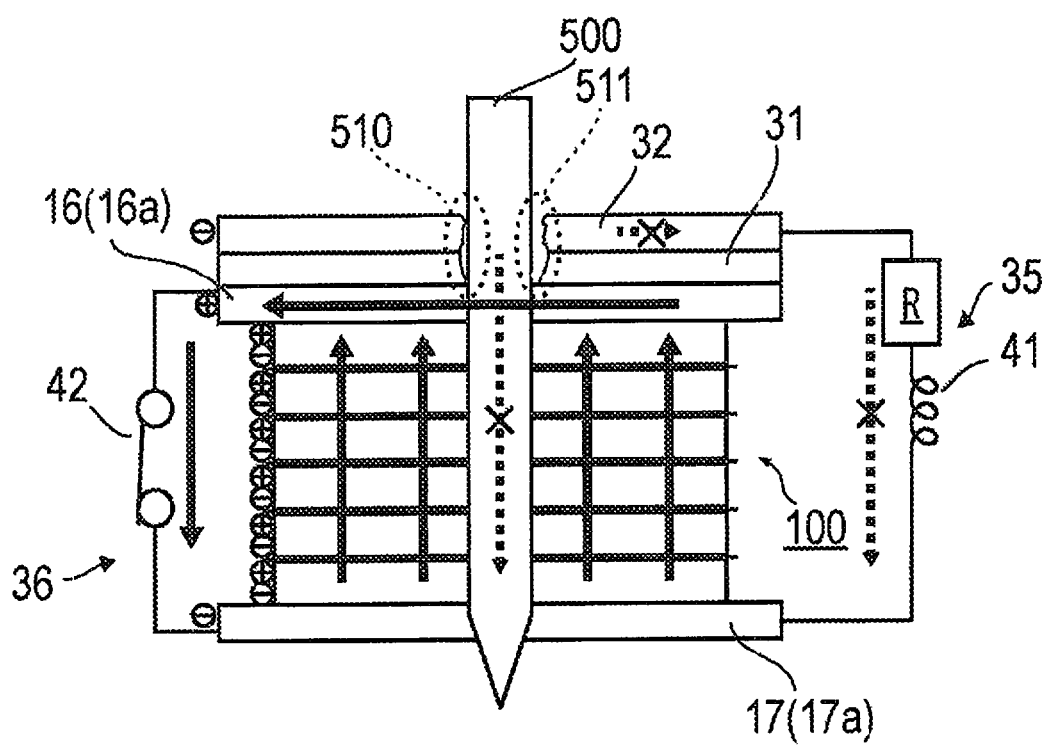

FIGS. 2 to 5 are drawings for describing the actions of the bipolar secondary battery 1 according to the first embodiment, using a nail penetration test as an example. FIG. 2 is a pattern diagram of a state before nail penetration, FIG. 3 is a pattern diagram of a state immediately after nail penetration, FIG. 4 is a pattern diagram of a state after the nail has passed through, and FIG. 5 is a pattern diagram of another state after the nail has passed through.

In a state before penetration by a nail 500 as shown in FIG. 2, current is not flowing to the coil 41, and the switch 42 is opened and not in electrical continuity.

When the nail penetration test is begun and the nail 500 passes through the electroconductive member 32 and reaches the positive electrode collector board 16 as shown in FIG. 3, the positive electrode collector board 16 has electrical continuity with the electroconductive member 32 via the nail 500. Current then flows through the pathway of the electroconductive member 32, the resistor R, the coil 41, and the negative electrode tab 17a, this pathway being the external short circuit 35 (the arrows in the diagram indicate the flow of current, as with the other drawings). The instant that current flows to the coil 41, the switch 42 of the relay 40 closes (ON), and current flows from the positive electrode tab 16a to the negative electrode tab 17a via the external discharge safety circuit 36. Specifically, the flow of current between the electroconductive member 32 and the negative electrode tab 17a connected thereto is detected by the coil 41, and current is caused to flow between the positive electrodes and negative electrodes of the power generation element 100 through the external discharge safety circuit 36.

Energy accumulated in the power generation element 100 is thereby released by the external discharge safety circuit 36. Moreover, the external discharge safety circuit 36 side has only wiring resistance and therefore has lower contact resistance than that between the nail 500 and the electroconductive member 32. Furthermore, due to the presence of the resistor R in the first embodiment, circuit resistance of the external short circuit 35 is higher than circuit resistance of the external discharge safety circuit 36. Therefore, current going to the external discharge safety circuit 36 flows more readily than current passing through the nail 500. Therefore, most of the energy is discharged to ground (earth), etc., through the external discharge safety circuit 36.

When the nail 500 penetrates further, the nail 500 reaches deeper into the power generation element 100 as shown in FIG. 4. In this state, the nail 500 comes into contact with the collectors inside the power generation element 100, the active materials, the electrolytic solution, and the negative electrode collector board 17 as well, and internal short circuiting occurs through the nail 500. However, in the first embodiment, the positive electrodes and negative electrodes are directly short-circuited by the external discharge safety circuit 36, and the flow of current through the nail 500 is therefore small (the dash-line arrow and the × mark in the drawing indicate that current flow is small or current has ceased to flow; likewise in other drawings).

There are also cases in which, in the portion of contact between the electroconductive member 32 and the nail 500 after the nail 500 has passed through as shown in FIG. 5, contact is light and resistance is high (a portion enclosed in a dotted-line circle 510 in FIG. 5), or there is no contact and the electrical connection is cut off (a portion enclosed in a dotted-line circle 511 in FIG. 5). In the event of such a state, in the prior art there has only been a circuit equivalent to the external short circuit 35; therefore, there would be a large amount of heat in the portion of contact with the nail 500, or there would be little current flowing to the external short circuit 35.

In the first embodiment, current flow to the external short circuit 35 is detected, and the positive electrode tab 16a and negative electrode tab 17a are short-circuited. Therefore, energy is released by the external discharge safety circuit 36 outside of the power generation element 100 even if the portion of contact between the electroconductive member 32 and the nail 500 after the nail 500 is high in resistance or contact is cut off. Therefore, any temperature increase in the portion of contact with the nail 500 can be minimized, and any temperature increase within the power generation element 100 can be minimized. Any local temperature increase within the power generation element 100 can also be minimized because within the power generation element 100, the internal resistance of the battery causes heat to be moderately generated throughout the entire power generation element 100.

Second Embodiment

Figure 6:
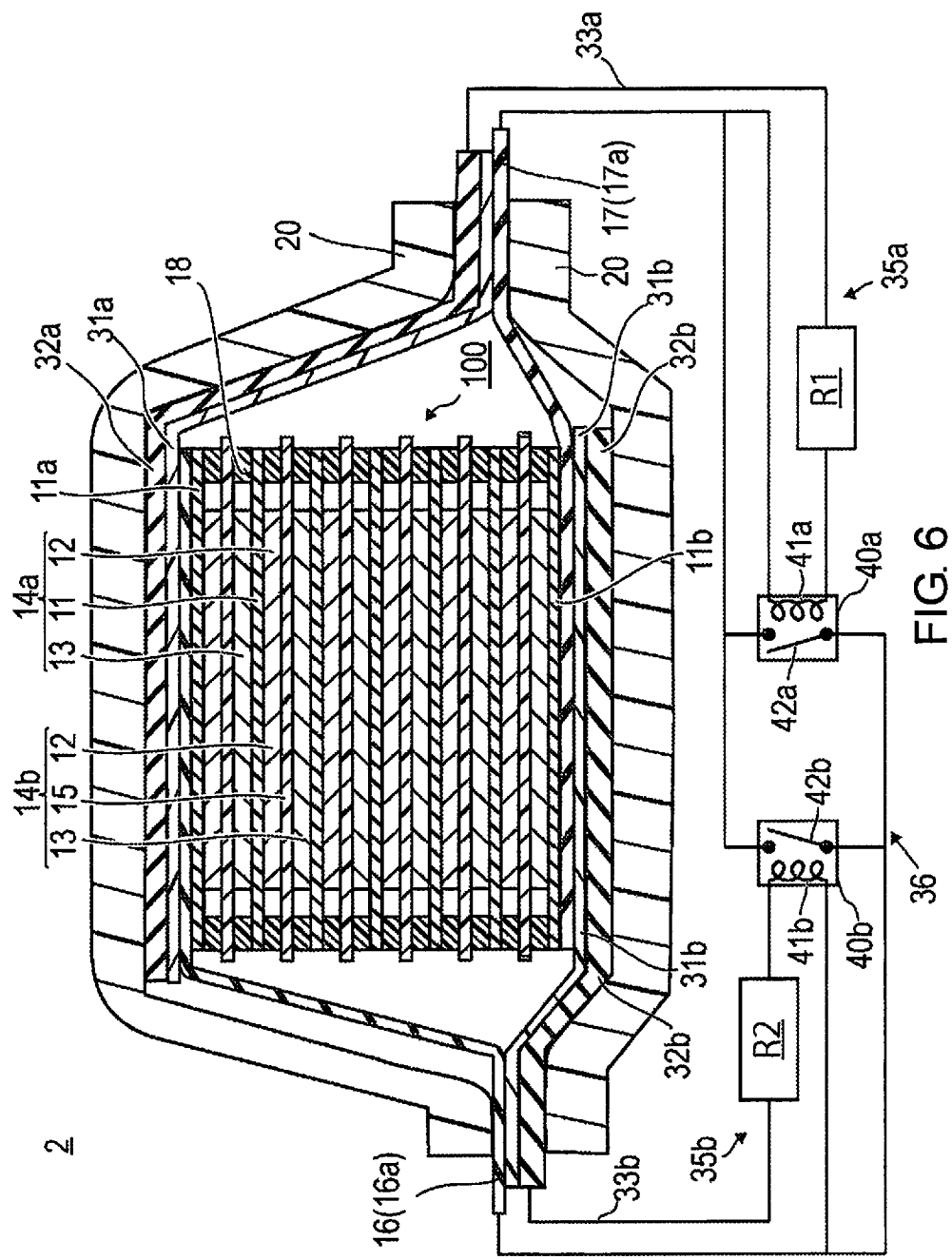
FIG. 6 is a schematic diagram of an overall structure of a bipolar secondary battery according to a second embodiment.

FIG. 6 is a schematic diagram of an overall structure of a bipolar secondary battery according to a second embodiment.

A power generation element 100 of a bipolar secondary battery 2 is the same as the power generation element 100 of the first embodiment, as shown in FIG. 6.

In the second embodiment, a first electroconductive member 32a is stacked outward from the positive electrode collector board 16 in the direction in which the unit cell layers 14b are stacked, with an insulation member 31a interposed between the positive electrode collector board 16 and the first electroconductive member 32a. The insulation member 31a prevents contact between the positive electrode collector board 16 and the first electroconductive member 32a and electrically insulates the two members from each other.

One end of the first electroconductive member 32a is led out of the exterior material 20 and is electrically connected to the negative electrode tab 17a by a first lead wire 33a. Specifically, the first electroconductive member 32a is electrically connected to the negative electrode tab 17a, which is a negative electrode of the power generation element 100. Therefore, the first electroconductive member 32a is electrically connected to an electrode having an opposite polarity to of that of the electrode in the outermost layer at the side where the first electroconductive member 32a is disposed.

A resistor R1 and a first coil 41a of a first relay 40a are connected partway along the first lead wire 33a. In other words, the first electroconductive member 32a is connected to one end of the first coil 41a via the resistor R1, and another end of the first coil 41a is connected to the negative electrode tab 17a. In this embodiment, the pathway through the first lead wire 33a along the first electroconductive member 32a, the resistor R1, the first coil 41a, and the negative electrode tab 17a is referred to as a first external short circuit 35a.

In the first external short circuit 35a, the first electroconductive member 32a is electrically connected to the negative electrode tab 17a, but is electrically insulated from the positive electrode collector board 16 by the insulation member 31a. Therefore, in a normal state (the state shown in FIG. 6), current does not flow to the first coil 41a and the resistor R1.

The resistor R1 is a load for protecting the first relay 40a (particularly the coil) when current flows to the first external short circuit 35a (described hereinafter). Attaching the resistor R1 has the action of enabling current to flow more easily to an external discharge safety circuit 36 when current flows to the first external short circuit 35a (the details will be described hereinafter). Current flows to the first external short circuit 35a when the first electroconductive member 32a is pierced and a conductor has entered. Contact resistance between the entered conductor and the first electroconductive member 32a is higher than normal wiring resistance. Therefore, even without the resistor R1, current would flow more easily to the external discharge safety circuit 36 than to the first external short circuit 35a. Therefore, the resistor R1 may be omitted if the first relay 40a has sufficient voltage resistance.

In the second embodiment, a second electroconductive member 32b is stacked outward from the negative electrode collector board 17 in the direction in which the unit cell layers 14b are stacked, with an insulation member 31b interposed between the negative electrode collector board 17 and the second electroconductive member 32b. The insulation member 31b prevents contact between the negative electrode collector board 17 and the second electroconductive member 32b and electrically insulates the two members from each other.

One end of the second electroconductive member 32b is led out of the exterior material 20. The second electroconductive member 32b is electrically connected to the positive electrode tab 16a by a second lead wire 33b. Specifically, the second electroconductive member 32b is electrically connected to the positive electrode tab 16a, which is a positive electrode of the power generation element 100. Therefore, the second electroconductive member 32b is electrically connected to an electrode having an opposite polarity to of that of the electrode in the outermost layer at the side where the second electroconductive member 32b is disposed.

A resistor R2 (described hereinafter) and a second coil 41b of a second relay 40b are connected partway along the second lead wire 33b. In other words, the second electroconductive member 32b is connected to one end of the second coil 41b via the resistor R2, and another end of the second coil 41b is connected to the positive electrode tab 16a. In this embodiment, the pathway through the second lead wire 33b along the positive electrode tab 16a, the resistor R2, the second coil 41b, and the second electroconductive member 32b is referred to as a second external short circuit 35b.

In the second external short circuit 35b, the second electroconductive member 32b is electrically connected to the positive electrode tab 16a, but is electrically insulated from the negative electrode collector board 17 by the insulation member 31b. Therefore, in a normal state (the state shown in FIG. 6), current does not flow to the second coil 41b and the resistor R2.

The resistor R2 is similar to the resistor R1. When current flows to the second external short circuit 35b, the resistor R2 is a load for protecting the second relay 40b, and the resistor R2 enables current to flow more easily to the external discharge safety circuit 36. The resistor R2 need not be similar to the resistor R1.

The first electroconductive member 32a and the second electroconductive member 32b are disposed facing each other across the power generation element 100. The first electroconductive member 32a and the second electroconductive member 32b both have an area equal to or greater than the area of the electrodes (an area of a surface intersecting a stacking direction of the power generation element). This area is essentially an area equal to or greater than whichever of the positive electrode collector board 16 and the negative electrode collector board 17 is larger. Due to the electroconductive members being this size, a conductor (e.g., a nail of a nail penetration test) would definitely come into contact with one of or both the first electroconductive member 32a and the second electroconductive member 32b if the conductor were to enter the power generation element 100.

Thus, the first electroconductive member 32a and the second electroconductive member 32b are disposed so as to be on either side of the power generation element 100 along the stacking direction. The first electroconductive member 32a and the second electroconductive member 32b are respectively electrically connected to electrodes having an opposite polarity to of that of the electrodes in the outermost layers at the sides where the first electroconductive member 32a and the second electroconductive member 32b are disposed.

The first electroconductive member 32a and the second electroconductive member 32b, as in the first embodiment, are preferably an electroconductive material as with the collectors and collector boards; for example, a metal or an electroconductive resin can be used.

The insulation members 31a, 31b are also preferably electrically insulative; a resin material can be used as in the first embodiment.

In the second embodiment, two relays, i.e., the first relay 40a and the second relay 40b are provided in order to electrically insulate the first external short circuit 35a and the second external short circuit 35b from each other. The first coil 41a and the second coil 41b are current detectors, and a first switch 42a and a second switch 42b are opening-closing devices.

In the relays 40a and 40b, one terminal of each of the first switch 42a and the second switch 42b is connected to the positive electrode tab 16a, and another terminal is connected to the negative electrode tab 17a. The first switch 42a and the second switch 42b are constantly open (OFF), and are attached so as to actuate to closed (ON) due to current flowing to the first coil 41a and the second coil 41b. The relays 40a and 40b are provided in parallel with the positive electrode tab 16a and the negative electrode tab 17a. If either one of the first switch 42a and second switch 42b is closed (ON), the positive electrode tab 16a and the negative electrode tab 17a short-circuit. Therefore, the positive electrodes and negative electrodes of the power generation element 100 are short-circuited by the operation of the first switch 42a or the second switch 42b.

The relays 40a and 40b used in the second embodiment are, for example, bistable relays (latching relays). In the second embodiment, the first switch 42a and the second switch 42b in an open (OFF) state electrically insulate the negative electrode tab 17a from the positive electrode tab 16a in a state in which current does not flow to the first coil 41a and the second coil 41b. When current flows to the first coil 41a and the second coil 41b, the first switch 42a and the second switch 42b close (ON) and electrically connect the negative electrode tab 17a with the positive electrode tab 16a. Once the first switch 42a and the second switch 42b have closed (ON), the first switch 42a and the second switch 42b remain in a closed state even if current ceases to flow to the first coil 41a and the second coil 41b. Therefore, the state in which the negative electrode tab 17a is electrically connected to the positive electrode tab 16a is maintained. Relays other than bistable relays can be used; it is possible to use relays, magnet switches, electromagnetic opening-closing devices, etc., with which the pathway between the positive electrode tab 16a and the negative electrode tab 17a is open (OFF) when electricity is not conducted to the coils and is closed (ON) when electricity is conducted to the coils, and the pathway does not revert back thereafter.

The pathway in which outside of the power generation element 100 (outside of the exterior material), the positive electrode tab 16a and the negative electrode tab 17a are electrically connected by the relays 40a and 40b, constitutes the external discharge safety circuit 36. The first external short circuit 35a and the second external short circuit 35b of the second embodiment operate in the same manner as the external short circuit 35 of the first embodiment.

Thus, in the second embodiment, the first electroconductive member 32a and the second electroconductive member 32b are disposed so as to be on either side of the power generation element 100 along the stacking direction of the unit cell layers 14b. Due to this configuration, in the second embodiment, as well, as in the first embodiment, any temperature increase in the portion of contact with the conductor can be minimized, and any temperature increase within the power generation element 100 can be minimized. Any local temperature increase within the power generation element 100 can also be minimized because within the power generation element 100, the internal resistance of the battery causes heat to be moderately generated throughout the entire power generation element 100.

Third Embodiment

A third embodiment is a stacked secondary battery (non-bipolar).

Figure 7:
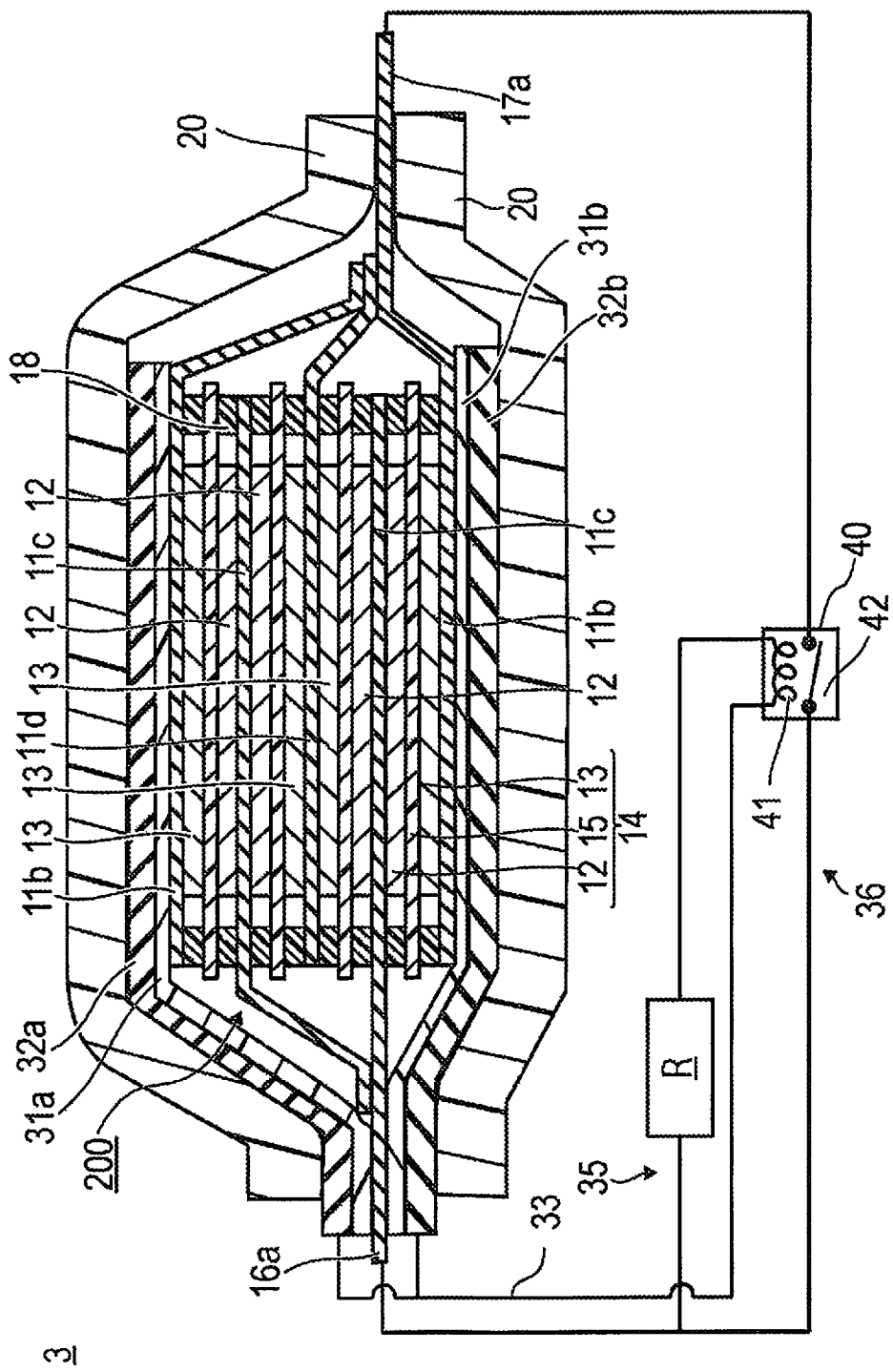
FIG. 7 is a schematic diagram of an overall structure of a stacked secondary battery according to a third embodiment.

FIG. 7 is a schematic diagram of an overall structure of a stacked secondary battery according to the third embodiment.

A stacked secondary battery 3 of the third embodiment has a structure in which a power generation element 200 that performs charging and discharging is sealed within an exterior material 20.

In the power generation element 200, except for the outermost layers, electrodes of the same polarity are formed on both surfaces of planar collectors. In this embodiment, these collectors are positive electrode collectors 11c having positive electrodes 12 formed on both surfaces, and a negative electrode collector 11d having negative electrodes 13 formed on both surfaces. In the embodiment shown in FIG. 7, the outermost layers at both sides along the stacking direction contain negative-electrode-side outermost-layer collectors 11b in which a negative electrode 13 is formed on one surface of each.

The positive electrodes 12 and the negative electrodes 13 are disposed so as to face each other with separators 15 interposed therebetween, thus forming unit cell layers 14, and the unit cell layers 14 are stacked. Therefore, the power generation element 200 has a structure in which unit cell layers 14, which are each comprised of a positive electrode 12 positioned on one surface of a separator 15 and a negative electrode 13 positioned on the other surface of the same separator 15, are stacked with the collectors 11b, 11c, 11d interposed between the unit cell layers 14.

A plurality of the positive electrode collectors 11c are connected to each other, and any one positive electrode collector 11c is led out of the exterior material 20 to constitute a positive electrode tab 16a (the collector 11c and the positive electrode tab 16a may be separate members electrically connected). Therefore, the positive electrode tab 16a, which is a portion in which the plurality of positive electrode collectors 11c are connected to each other, is a positive electrode of the power generation element 200.

The plurality of negative electrode collectors 11b, 11d are connected to each other, and any one collector (the 11b in the drawing) is led out of the exterior material 20 to constitute a negative electrode tab 17a (the negative electrode collectors 11b, 11d and the negative electrode tab 17a may be separate members electrically connected). Therefore, the negative electrode tab 17a, which is a portion in which the plurality of negative electrode collectors 11b, 11d are connected to each other, is a negative electrode of the power generation element 200.

A plurality of unit cell layers 14 are thereby electrically connected in parallel. The number of stacked unit cell layers 14 is not limited and can be adjusted according to the desired capacity.

The power generation element 200 has seal parts 18 in contact with outer peripheral edges of the collectors 11b, 11c, 11d. The seal parts 18 are formed by an insulating seal material. The seal parts 18 are secured to end parts at the outer peripheries of the collectors 11, and each seal part is disposed between two separators 15. The seal parts 18 prevent contact between adjacent collectors 11b, 11c, 11d in the power generation element 200, and short-circuiting caused by slight unevenness in end parts of the unit cell layers 14.

A first electroconductive member 32a and a second electroconductive member 32b are stacked on outward sides of both negative-electrode-side outermost-layer collectors 11b along the stacking direction of the unit cell layers 14, with insulation members 31a and 31b interposed between the electroconductive members and the outermost-layer collectors. Therefore, the first electroconductive member 32a and the second electroconductive member 32b are disposed facing each other with the power generation element 200 in between. In the third embodiment, the electrodes of the outermost layers of the power generation element 200 are both negative electrodes. The first electroconductive member 32a and the second electroconductive member 32b are both led out of the exterior material 20 at one end and are electrically connected to each other (the first electroconductive member 32a and the second electroconductive member 32b may be electrically connected within the exterior material 20). The first electroconductive member 32a and the second electroconductive member 32b are connected to the positive electrode tab 16a by one lead wire 33, via a resistor R and a coil 41 of a relay 40 interposed partway along the lead wire.

A circuit formed by this lead wire 33 is similar to the external short circuit 35 of the first embodiment. The rest of the configuration is similar to the first embodiment and therefore shall not be described here.

The embodiment shown in FIG. 7 is not provided by way of limitation on the battery structure of the third embodiment. For example, the power generation element may have positive electrodes 12 in the outermost layers. In this case, the first electroconductive member 32a and the second electroconductive member 32b are connected to the negative electrodes by a circuit equivalent to the external short circuit 35 shown in the first embodiment. Power generation elements of other embodiments can have positive electrodes 12 in one outermost layer side and negative electrodes 13 in the other outermost layer side. In this case, the first electroconductive member 32a is provided in one outermost layer side, the second electroconductive member 32b is provided in the other outermost layer side, and a first external short circuit 35a and second external short circuit 35b are provided, these circuits being insulted from each other.

Thus, the first electroconductive member 32a and the second electroconductive member 32b are disposed on either side of the power generation element 200 along the stacking direction. The first electroconductive member 32a and the second electroconductive member 32b are respectively electrically connected to electrodes having an opposite polarity to of that of the electrodes in the outermost layers at the sides of the power generation element 200 where the electroconductive members 32 are disposed. Therefore, the first electroconductive member 32a and the second electroconductive member 32b are not necessarily connected to electrodes of mutually different polarities, but could be connected to electrodes of the same polarity or connected to electrodes of different polarities, depending on the polarity of the electrodes in the outermost layers of the power generation element.

The stacked secondary battery (non-bipolar) of the third embodiment can also have a configuration in which an electroconductive member is provided only to one end of the power generation element 100 along the stacking direction of the unit batteries. Specifically, either only the first electroconductive member 32a or only the second electroconductive member 32b would be provided.

Actions

The actions of the stacked secondary battery 3 according to the third embodiment shall be described, using a nail penetration test as an example.

Figure 8:
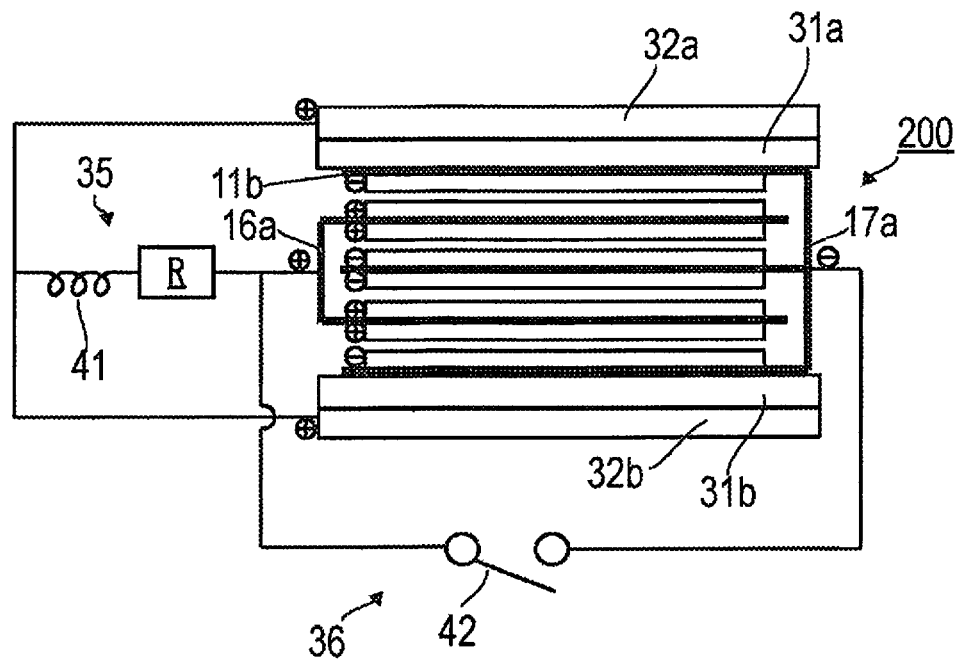
FIG. 8 is a pattern diagram of a state before nail penetration.
Figure 9:
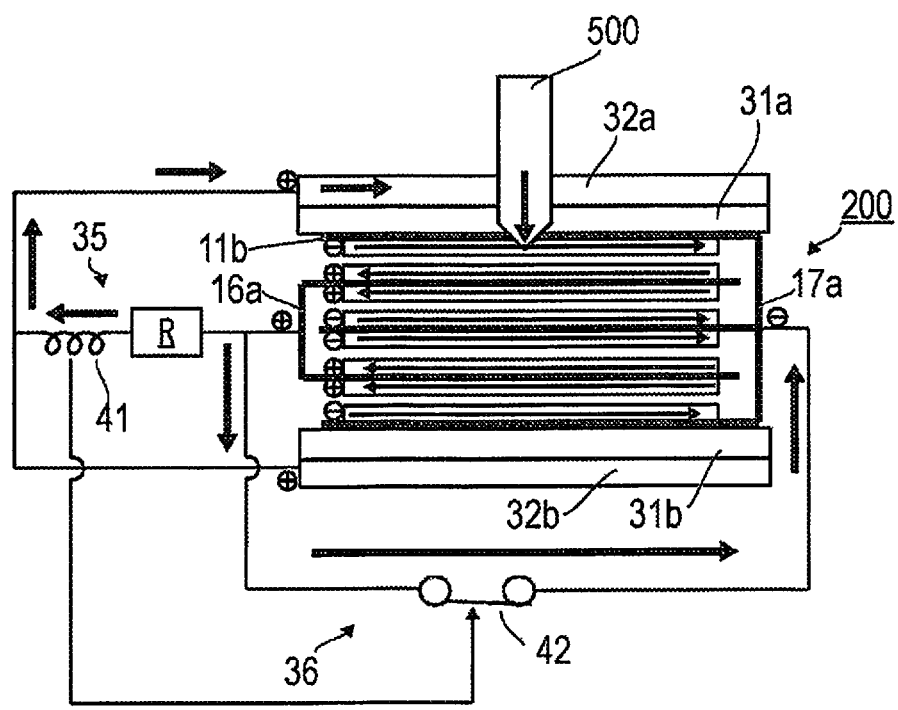
FIG. 9 is a pattern diagram of a state after nail penetration.
Figure 10:
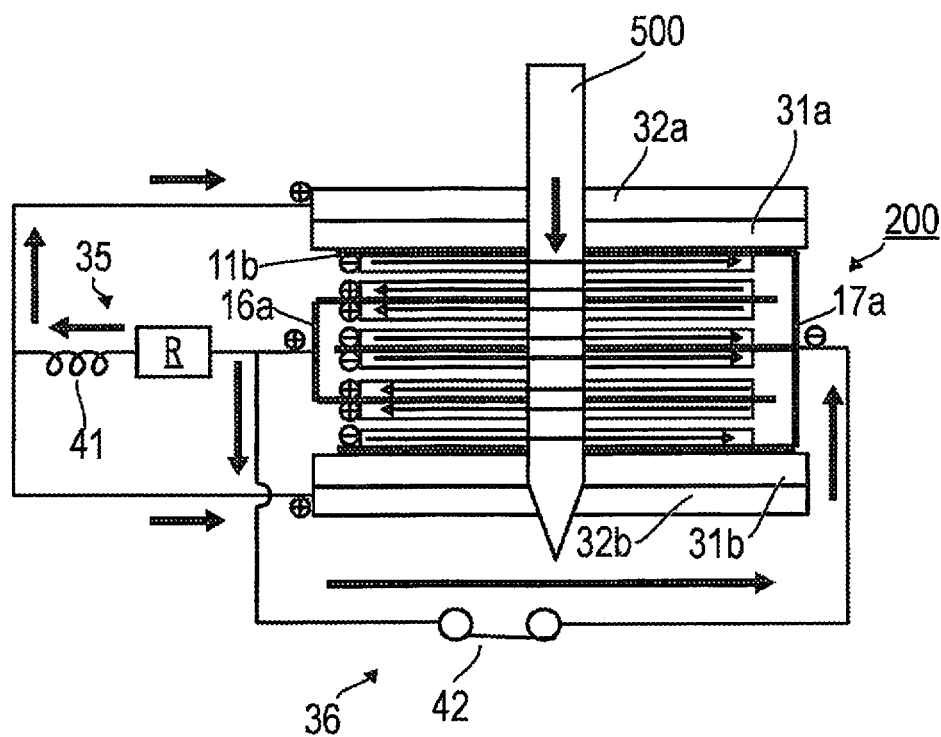
Figure 11:
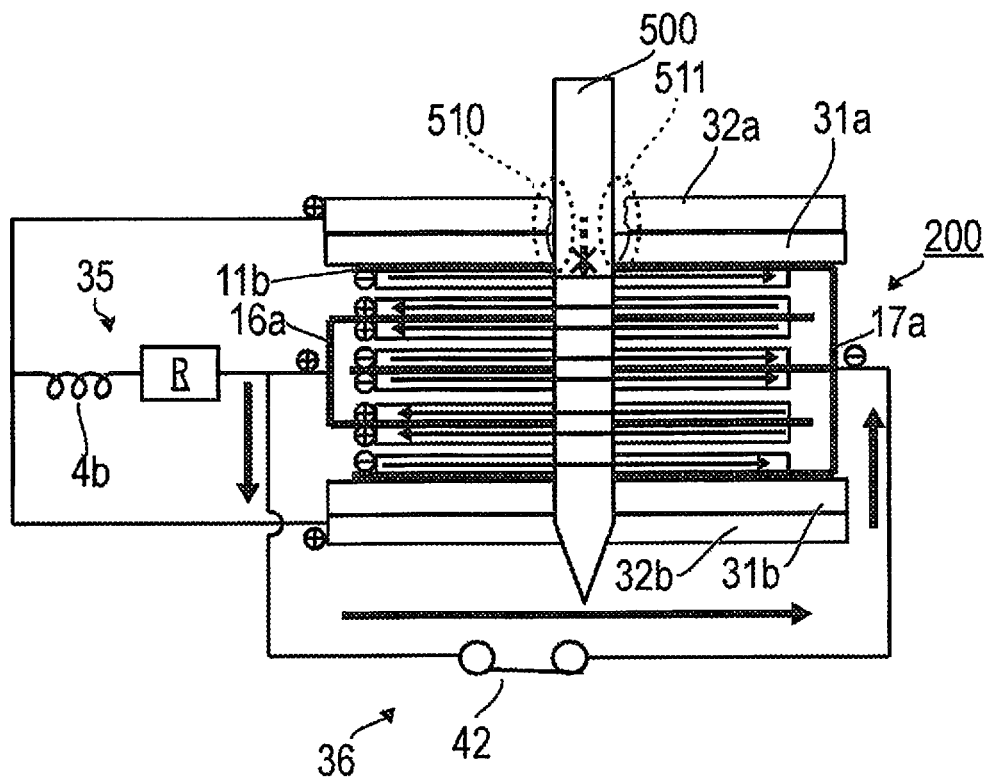

FIGS. 8 to 10 are drawings for illustrating actions of the stacked secondary battery according to the third embodiment using a nail penetration test as an example. FIG. 8 is a pattern diagram of a state before nail penetration, FIG. 9 is a pattern diagram of a state immediately after nail penetration, FIG. 10 is a pattern diagram of a state after the nail has passed through, and FIG. 11 is a pattern diagram of another state after the nail has passed through.

In a state before a nail 500 penetrates as shown in FIG. 8, current is not flowing to the coil 41, and the switch 42 is opened and not in electrical continuity.

When the nail penetration test is initiated and the nail 500 passes through the first electroconductive member 32a and reaches the negative-electrode-side outermost-layer collector 11b as shown in FIG. 9, the negative-electrode-side outermost-layer collector 11b has electrical continuity with the first electroconductive member 32a via the nail 500. Current then flows to the external short circuit 35. The instant that current flows to the coil 41, the switch 42 of the relay 40 closes (ON), and current flows from the positive electrode tab 16a to the negative electrode tab 17a. If this state is reached, energy accumulated in the power generation element 200 is released.

When the nail 500 penetrates further, the nail 500 reaches the interior of the power generation element 200 as shown in FIG. 10. In this state, the nail 500 comes into contact with the collectors inside the power generation element 200, the active materials, the electrolytic solution, and the second electroconductive member 32b as well, and internal short circuiting occurs through the nail 500. However, in the third embodiment, as in the first and second embodiments, the positive electrodes and negative electrodes are directly short-circuited by the external discharge safety circuit 36, and the flow of current through the nail 500 is therefore small.

There are also cases in which, in the portion of contact between the first electroconductive member 32a and the nail 500 after the nail 500 has passed through as shown in FIG. 11, contact force is light and resistance is high (a portion enclosed in a dotted-line circle 510 in FIG. 11), or the electrical connection is cut off (a portion enclosed in a dotted-line circle 511 in FIG. 11). When such a state occurs, in the third embodiment, as in the first embodiment, current flow to the external short circuit 35 is detected, current flows outside of the power generation element 200 due to the external discharge safety circuit 36, and the current flowing into the power generation element 200 can therefore be reduced. Therefore, any temperature increase in the portion of contact with the nail 500 can be minimized, and any temperature increase within the power generation element 200 can be minimized. In the third embodiment, any local temperature increase within the power generation element 200 can also be minimized because within the power generation element 200, the internal resistance of the battery causes heat to be moderately generated throughout the entire power generation element 200.

Fourth Embodiment

In a fourth embodiment, an external discharge safety circuit is controlled by a control unit.

Figure 12:
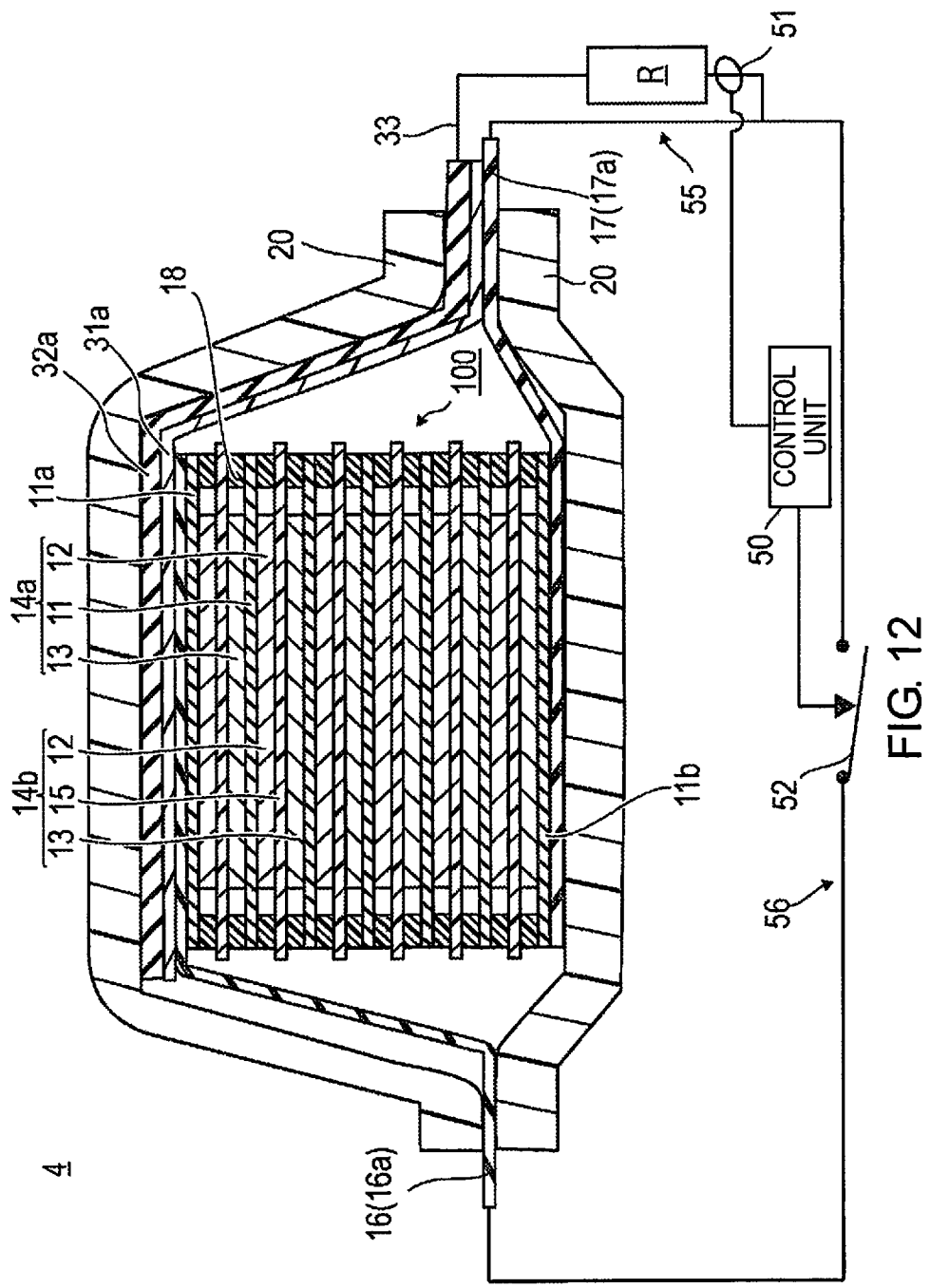
FIG. 12 is a schematic diagram of an overall structure of a secondary battery according to the fourth embodiment.

FIG. 12 is a schematic diagram of an overall structure of a secondary battery according to the fourth embodiment.

A secondary battery 4 according to the fourth embodiment has a power generation element 100 of a bipolar secondary battery, as with the first embodiment. In the fourth embodiment, as in the first embodiment, an electroconductive member 32 is stacked on an outward side of a positive electrode collector board 16 with an insulation member 31 interposed therebetween. The power generation element can be the stacked battery (non-bipolar) shown in the third embodiment.

In the fourth embodiment, a configuration of an external short circuit 55 and an external discharge safety circuit 56 differs from that of the first embodiment.

In the external short circuit 55, an electroconductive member 32 is electrically connected to a negative electrode tab 17a by a lead wire 33, via a resistor R. A DC current sensor 51 is attached to the lead wire 33.

The purpose of the resistor R is to enable current to flow easily to the external discharge safety circuit 56 in order to avoid rapid voltage increases in the external short circuit 55. In the fourth embodiment, the resistor R is not needed if voltage resistance of the lead wire 33 is sufficient because no coil of a relay circuit is present in the external short circuit 55.

The DC current sensor 51 may be, for example, a well-known sensor; this sensor is electrically insulated from a primary wire (the lead wire 33 in this embodiment) which is the object of current detected, and the sensor outputs a signal when current flows to the primary wire. Such a current sensor can be, for example, one that uses a Hall element or another well-known sensor.

The DC current sensor 51 is a current detector and is connected to a control unit 50. The DC current sensor 51 outputs a signal to the control unit 50 when current flowing to the lead wire 33 is detected.

The external discharge safety circuit 56 electrically connects a positive electrode tab 16a and the negative electrode tab 17a via a switch 52 that, partway along the circuit, is opened and closed by a command from the control unit 50. In a normal state, the switch 52 is constantly open (OFF). For example, a solid stator relay (SSR) is capable of high-speed operation and is therefore preferred as the switch 52.

The control unit 50 is a part of the external discharge safety circuit 56. The control unit 50 closes (ON) the switch 52 and short-circuits the positive electrode tab 16a (positive electrode) and the negative electrode tab 17a (negative electrode) at the point in time when a signal from the DC current sensor 51 is received. The control unit 50 is, for example, a computer, and is configured from a CPU, ROM, RAM, etc. Such a control unit 50 uses programs stored in advance to carry out the operation receiving a signal from the DC current sensor 51 and closing (ON) the switch 52.

Figure 13:
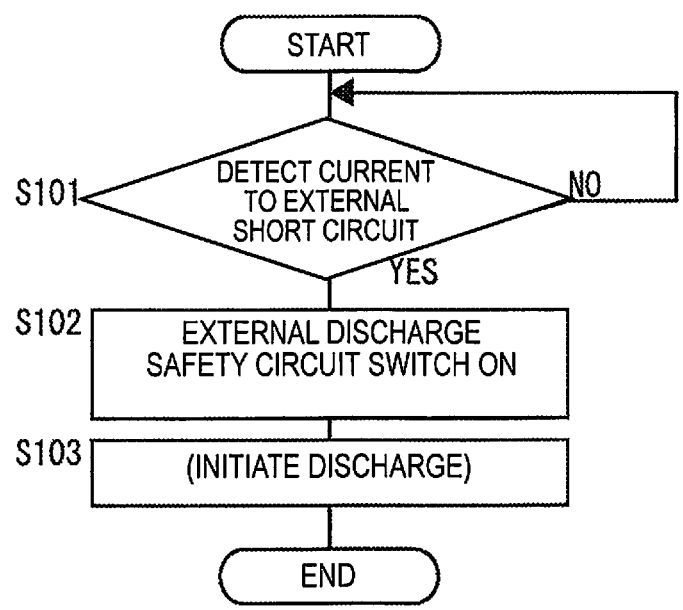
FIG. 13 is a flowchart describing a routine of a control unit.

FIG. 13 is a flowchart describing a routine of the control unit 50.

The control unit 50 assesses, according to the signal from the DC current sensor 51, whether or not current has flowed to the lead wire 33 within the external short circuit 55 (S101).

If it is assessed that current has flowed to the external short circuit 55 (S101: YES), the control unit 50 sets the switch 52 of the external discharge safety circuit 56 to ON (S102). The energy of the power generation element is thereby discharged (S103). Additionally, the process ends.

If it is assessed that current has not flowed to the external short circuit 55 (S101: NO), this assessment of S101 is repeated. This state is a normal state, and the switch 52 is OFF.

Thus, in the fourth embodiment, when a conductor, etc., has entered the secondary battery, the control unit 50 detects through the signal from the DC current sensor 51 that current has flowed to the external short circuit 55. The control unit 50 thereby actuates the switch 52 and releases the energy of the power generation element 100. Therefore, in the fourth embodiment, as in first to third embodiments, any temperature increase in the portion of contact with the conductor can be minimized, and any temperature increase within the power generation element 100 can be minimized. Additionally, any local temperature increase within the power generation element 100 can also be minimized because within the power generation element 100, the internal resistance of the battery causes heat to be moderately generated throughout the entire power generation element 100.

One such control unit 50 may be used for one secondary battery, but one control unit 50 may also be used for a plurality of secondary batteries. One external short circuit 55 and switch 52 each are provided to one secondary battery.

Due to one control unit 50 controlling a plurality of secondary batteries, in cases such as when, for example, a conductor enters one of the plurality of secondary batteries, energy is safely released also to the other secondary batteries placed near to the aforementioned. Energy can thereby be safely released also in a battery unit, etc., comprised of a plurality of secondary batteries.

The control unit 50 can be dedicated for a secondary battery, or can serve also as a control unit for other controls. For example, in a secondary battery installed in a vehicle, the control unit of the vehicle can also be designed to control the secondary battery. As in first to third embodiments, an external discharge safety circuit 36 that relies on a simple relay 40 may be provided to individual secondary batteries, and a control unit 50 and a DC current sensor 51 may also be provided. The external discharge safety circuits 36 of the individual secondary batteries would each operate individually, and would be caused to operate also by signals from the control unit 50. Due to this configuration, an external discharge safety circuit 36 would function even with one secondary battery alone, and in the case that an external discharge safety circuit 36 functions with one of a plurality of secondary batteries when the batteries are installed in a vehicle, etc., the external discharge safety circuits 36 of the other secondary batteries could be caused to function as well.

Modification of the Fourth Embodiment

In the fourth embodiment, an example involving the use of a DC current sensor was described, but a voltage sensor may be used instead.

Figure 14:
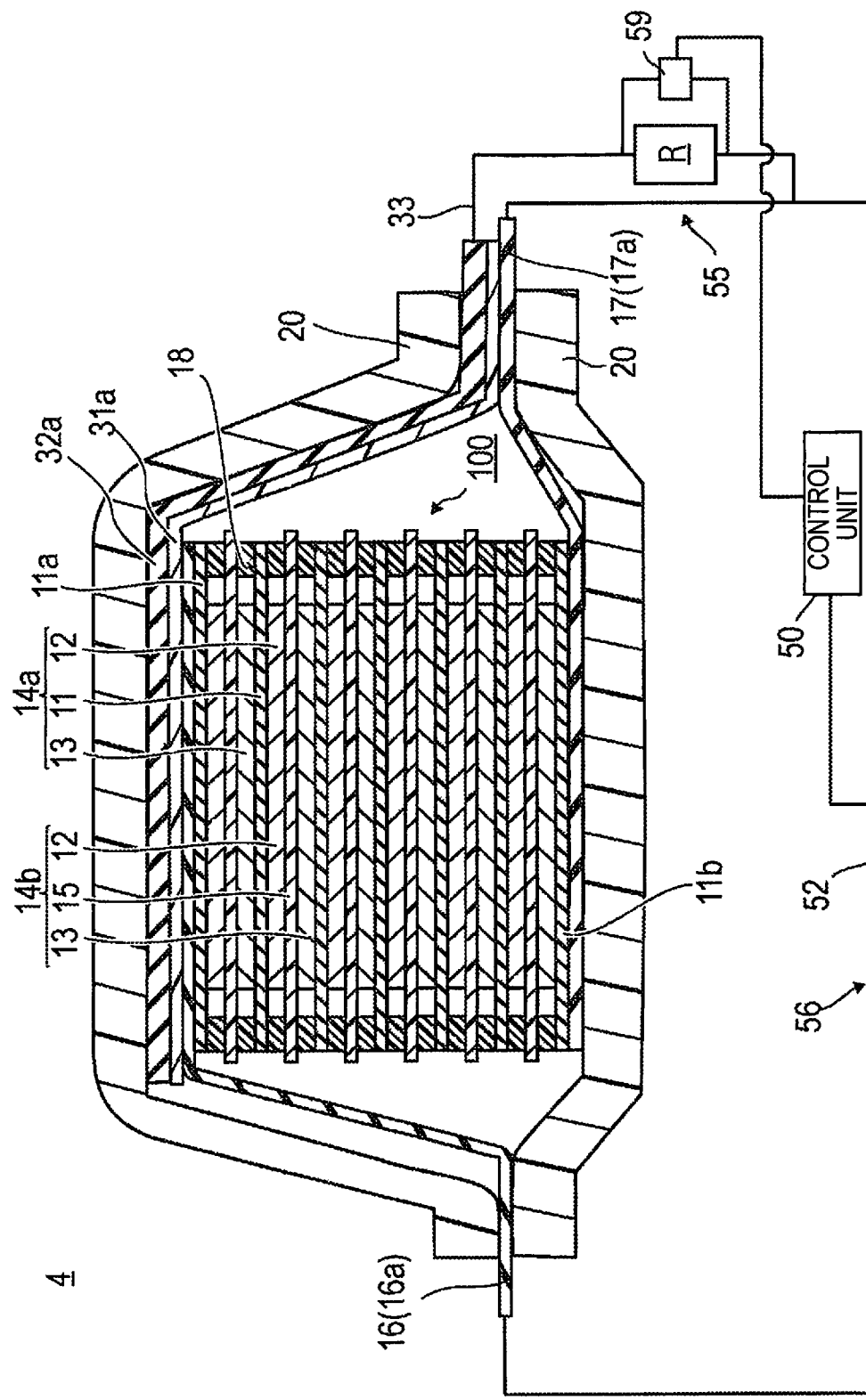
FIG. 14 is a schematic diagram of an overall structure of a secondary battery using a voltage sensor, which is another configuration (a modification) according to the fourth embodiment.

FIG. 14 is a schematic diagram of an overall structure of a secondary battery in a case in which a voltage sensor is used, which is another configuration according to the fourth embodiment.

When a voltage sensor is used, a voltage sensor 59 is provided so as to detect voltage between both terminals of the resistor R. In a normal state, the voltage between both terminals of the resistor R is 0 V because current is not flowing. Current flowing to the resistor R causes a voltage difference between both terminals due to a drop in voltage caused by the resistor R. The voltage sensor 59 detects this voltage difference and transmits a signal to the control unit 50. In response to the signal from the voltage sensor 59, the control unit 50 actuates the external discharge safety circuit 56. Operation and action in this case are the same as when a current sensor is used and therefore shall not be described here.

Fifth Embodiment

Figure 15:
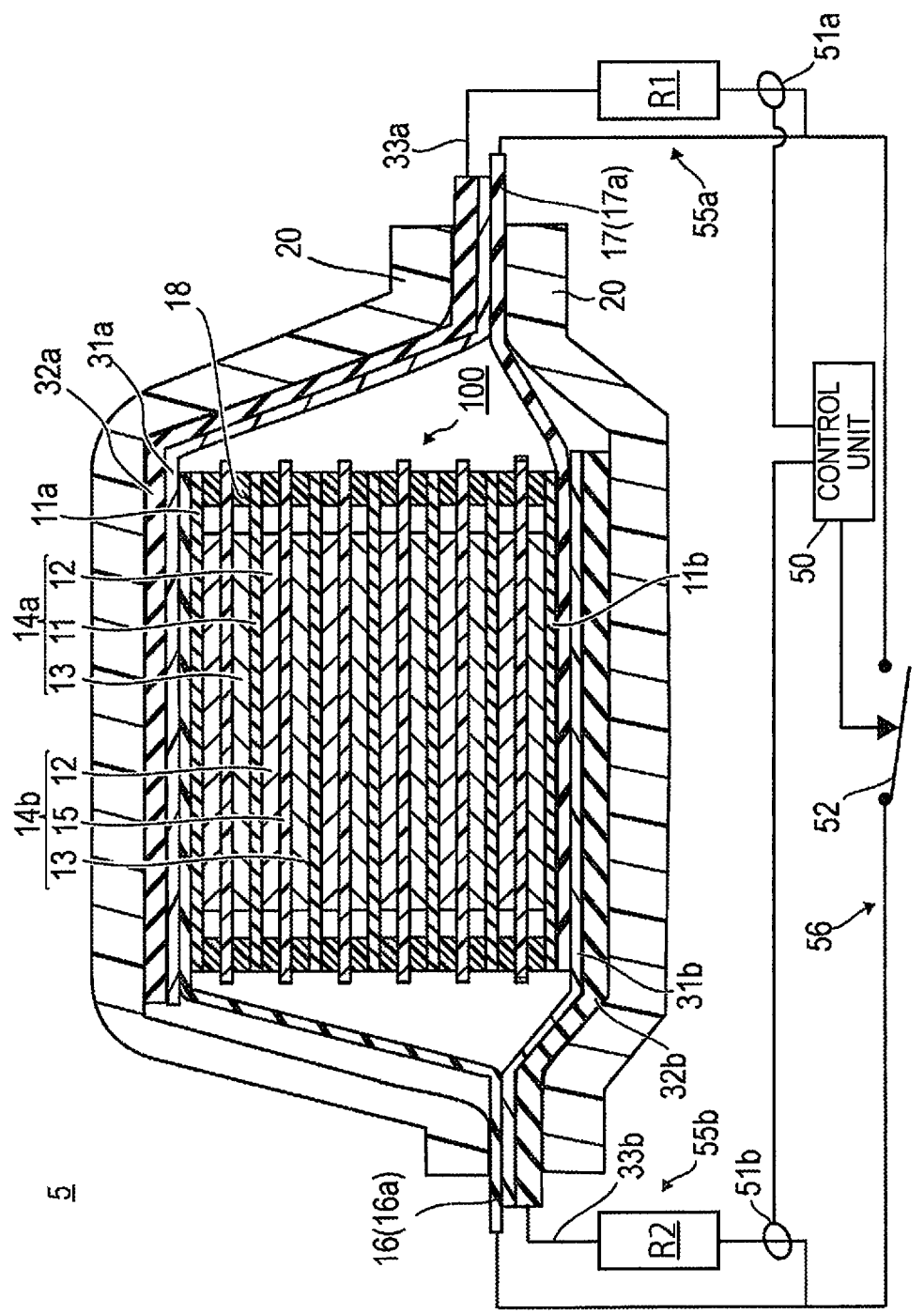
FIG. 15 is a schematic diagram of an overall structure of a secondary battery according to a fifth embodiment.

FIG. 15 is a schematic diagram of an overall structure of a secondary battery according to a fifth embodiment.

A secondary battery 5 of the fifth embodiment, as in the third embodiment, has a structure in which a first electroconductive member 32a is stacked on an outward side of a positive electrode collector board 16 with an insulation member 31a interposed therebetween, and a second electroconductive member 32b is stacked on an outward side of a negative electrode collector board 17 with an insulation member 31b interposed therebetween. A configuration of a power generation element 100 is also the same as that of the third embodiment.

The first electroconductive member 32a is connected to a negative electrode tab 17a by a first lead wire 33a, via a resistor R1. A DC current sensor 51a is provided to this first lead wire 33a. A pathway from the first electroconductive member 32a to the negative electrode tab 17a is referred to as a first external short circuit 55a.

The second electroconductive member 32b is connected to a positive electrode tab 16a by a second lead wire 33b, via a resistor R2. A DC current sensor 51b is provided to this second lead wire 33b. A pathway from the second electroconductive member 32b to the positive electrode tab 16a is referred to as a second external short circuit 55b.

A control unit 50 receives a signal indicating that either one of the DC current sensors 51a and 51b has detected a flow of current, sets a switch 52 of an external discharge safety circuit 56 to ON, and short-circuits the positive electrode tab 16a and the negative electrode tab 17a outside of the power generation element 100. Such a process of the control unit 50 is the same as the process in the fourth embodiment.

Due to this configuration, in the fifth embodiment, as in the fourth embodiment described above, any temperature increase in the portion of contact with the conductor can be minimized, and any temperature increase within the power generation element 100 can be minimized. Additionally, any local temperature increase within the power generation element 100 can also be minimized because within the power generation element 100, the internal resistance of the battery causes heat to be moderately generated throughout the entire power generation element 100.

In the fifth embodiment, as in the modification of the fourth embodiment, voltage sensors may be used in place of the DC current sensors 51a and 51b. Should voltage sensors be used, voltages between both terminals of each of the resistors R1 and R2 would be detected.

EXAMPLES

An example in which the above-described embodiment is applied shall be described.

A test battery of a lithium ion secondary battery was prepared, this battery having a battery (power generation element) structure of an 8-stack bipolar secondary battery, a capacity of 1.3 Ah, and a voltage of 33.6 V.

An electroconductive member was disposed on a positive electrode side of this test battery with an insulation member therebetween. The electroconductive member was connected to a negative electrode tab by a lead wire. A coil of a relay was connected to the lead wire, and a switch of the relay was connected between a positive electrode tab and the negative electrode tab of the test battery (i.e., the same structure as in FIG. 3).

A nail penetration test was performed on this test battery, and battery voltage (cell voltage), battery temperature (cell temperature), nail temperature, and current (cell current) between the positive electrode tab and the negative electrode tab were measured. A shunt resistor was connected between the positive electrode and negative electrode tabs in order to measure voltage and current. A resistance value of the shunt resistor was extremely small and near to a wiring resistance.

The nail penetration test was carried with a nail of SUS 304/φ3 mm, and at a nail penetration speed of 80 mm/sec and an outside air temperature of 25° C.

Figure 16:
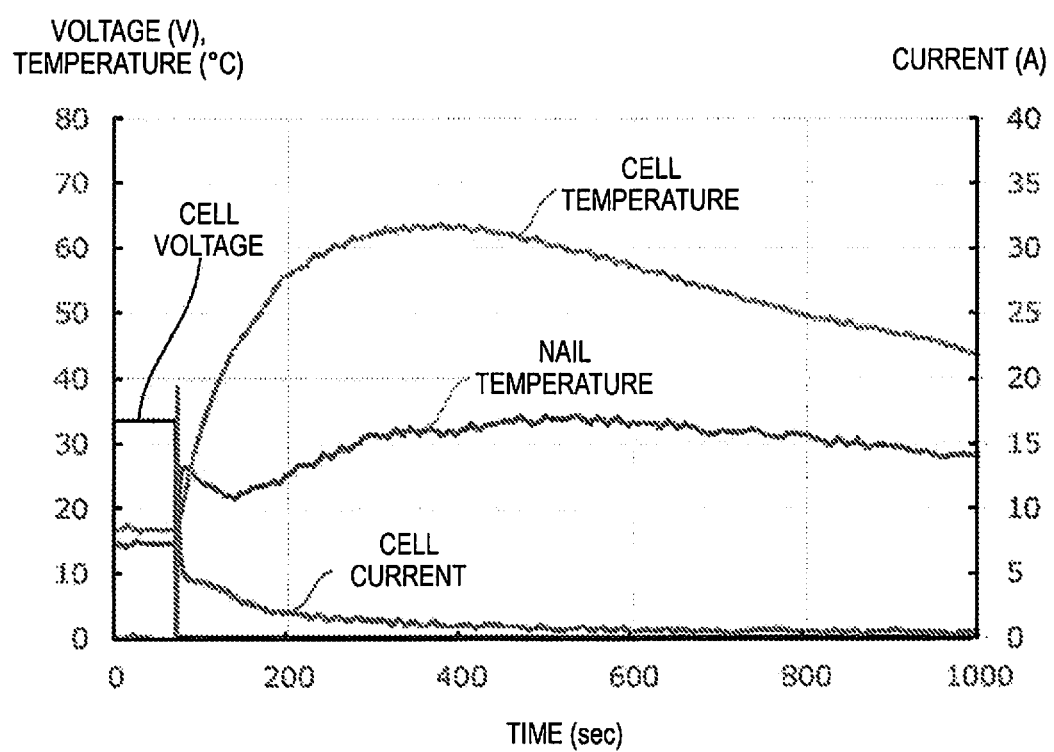
FIG. 16 is a graph showing results of a nail penetration test.

FIG. 16 is a graph showing the results of the nail penetration test. In this graph, the left vertical axis represents temperature and voltage, and the right vertical axis represents current. The horizontal axis represents elapsed time.

The test shall be described with reference to the graph.

(a) Before nail penetration, current is not flowing between the positive electrode tab and the negative electrode tab. The battery voltage is 33.6 V. The battery temperature is approximately room temperature. The nail temperature is close to room temperature and is somewhat low.

(b) At the time of nail penetration, it can be seen that the battery voltage instantly drops and currently suddenly flows.

(c) As time elapses thereafter, current flows albeit slightly. Therefore, it can be seen that at the instant of nail penetration, most of the energy is discharged. The battery temperature rises after the time point of nail penetration, but the maximum temperature is approximately 64° C. The battery temperature decreases as time elapses thereafter. The nail temperature only rises a small amount, and stops at approximately 34° C. at maximum. Furthermore, smoke was not confirmed by visual observation.

Comparative Example

A test battery similar to that of the example was prepared. An electroconductive member was placed on a positive electrode side with an insulator therebetween. The electroconductive member was connected to a negative electrode tab by a lead wire. However, unlike in the example, a relay circuit (external discharge safety circuit) joining the positive electrode tab and the negative electrode tab was not provided.

As a result of performing a nail penetration test in the same manner as in the example, smoke was visually confirmed. The battery temperature was estimated to be 500° C. or higher.

From the results of the example and the comparative example, it could be seen that in a nail penetration test, any increase in secondary battery temperature is minimized by using a secondary battery in which the present invention is applied.

According to the embodiments (including the example) described above, the following effects are achieved.

(1) In the present embodiments, when a conductor enters a power generation element through an exterior material, current flows between an electroconductive member provided to an outermost-layer side of the power generation element and an electrode of a polarity the reverse that of an electrode in an outermost layer at the side where the electroconductive member is provided. Due to this current being detected, a path between a positive electrode and a negative electrode of the power generation element is short-circuited through an external discharge safety circuit outside of the power generation element. A large amount of current flows to the external discharge safety circuit and energy of the power generation element is released because there is great contact resistance between the entered conductor and the electroconductive member. Due to this configuration, any temperature increase in the power generation element can be minimized, and any heat generation due to unstable contact between the entered conductor and the electroconductive member can be minimized. Additionally, any local temperature increase within the power generation element can be minimized because internal resistance of the power generation element causes heat to be moderately generated throughout the entire power generation element.

Once an opening-closing device (switch) has closed (ON), energy can be reliably released because the connection between the positive electrode and the negative electrode is maintained.

(2) A relay including a coil and a switch is used, current flowing between the electroconductive member and a positive electrode or negative electrode to which the electroconductive member is electrically connected is detected by the coil, and the switch of the relay is actuated by the current detection. Therefore, at times such as when the conductor has entered the interior of the power generation element, the energy of the power generation element can be safely released and any temperature increased can be minimized merely due to the current flowing to the coil.

(3) A current sensor or a voltage sensor is provided, current flowing between the electroconductive member and a positive electrode or negative electrode to which the electroconductive member is electrically connected is detected, and a control unit receives a signal from the current sensor or the voltage sensor and short-circuits the positive electrode and the negative electrode. The control unit, which is outside the power generation element, can thereby intensively detect conductor entry, etc., and safely release the energy of the power generation element.

(4) A first electroconductive member and a second electroconductive member are provided so as to face each other from outermost layers with the power generation element therebetween. It is thereby possible to release the energy of the power generation element and minimize any temperature increase in the power generation element even when a conductor has entered the power generation element from any surface. Additionally, any heat generation in the portion where the conductor has entered can also be minimized.

Embodiments and examples of the present invention were described above, but the above-described embodiments and examples are not provided by way of limitation on the present invention.

The invention claimed is:

1. A secondary battery comprising:
a power generation element having at least one unit cell layer including a positive electrode, a separator and a negative electrode stacked in that order;
an electroconductive member disposed on at least one outward side of the power generation element in a direction in which the unit cell layer is stacked with an electrical insulation member interposed between the electroconductive member and the power generation element;
an external short circuit electrically connecting the electroconductive member to an electrode of an opposite polarity to that of an electrode on an outermost layer of the power generation element where the electroconductive member is disposed;
a current detector arranged to detect whether or not current is flowing to the external short circuit; and
an external discharge safety circuit provided with an opening-closing device configured to electrically insulate a path between the positive electrode of the power generation element and the negative electrode of the power generation element when the current sensor has not detected current, and short-circuits the path between the positive electrode of the power generation element and the negative electrode of the power generation element outside the power generation element when the current sensor has detected current.

2. The secondary battery according to claim 1, wherein the current sensor and the opening-closing device include a relay having a coil and a switch;
the coil is interposed partway along the external short circuit, and the switch is placed so as to open and close the path between the positive electrode of the power generation element and the negative electrode of the power generation element; and
the switch is actuated by current flowing to the coil, short-circuiting the path between the positive electrode of the power generation element and the negative electrode of the power generation element.

3. The secondary battery according to claim 1, wherein the current sensor is a current sensor that detects a current flow to the external short circuit; and
the external discharge safety circuit has a control unit that receives a signal indicating that the current sensor has detected the current flow, and actuates the opening-closing device to short-circuit the path between the positive electrode of the power generation element and the negative electrode of the power generation element.

4. The secondary battery according to claim 1, wherein
the current sensor is a voltage sensor that detects that a current flow to the external short circuit according to a voltage drop in a resistor interposed partway along the external short circuit; and
the external discharge safety circuit has a control unit that receives a signal indicating that the voltage sensor has detected the current flow, and actuates the opening-closing device to short-circuit the path between the positive electrode of the power generation element and the negative electrode of the power generation element.

5. The secondary battery according to claim 1, wherein
the electrical insulation member includes a first electrical insulation member and a second electrical insulation member,
the electroconductive member includes a first electroconductive member disposed on a first outward side of the power generation element in the direction in which the unit cell layer is stacked with the first electrical insulation member interposed between the first electroconductive member and the power generation element, and a second electroconductive member disposed on a second outward side of the power generation element in the direction in which the unit cell layer is stacked with the second electrical insulation member interposed between the second electroconductive member and the power generation element;
the external short circuit includes a first external short circuit that electrically connects the first electroconductive member and the electrode having the opposite polarity to that of the electrode in the outermost layer where the first electroconductive member is disposed, and a second external short circuit that electrically connects the second electroconductive member and the electrode having the opposite polarity to that of the electrode in the outermost layer where the second electroconductive member is disposed; and
the external discharge safety circuit actuates the opening-closing device to short-circuit the path between the positive electrode of the power generation element and the negative electrode of the power generation element when the current sensor has detected current flow to at least either one of the first external short circuit and the second external short circuit.

6. A method for controlling the secondary battery according to claim 1, method a secondary battery comprising:
detecting current flowing to the external short circuit, and electrically short-circuiting a path between the positive electrode of the power generation element and the negative electrode of the power generation element outside the power generation element.

7. The method according to claim 6, wherein
the detecting of the current flow to the external short circuit, and the electrically short-circuiting of the path between the positive electrode of the power generation element and the negative electrode of the power generation element is performed by setting to ON a switch of a relay provided between the positive electrode of the power generation element and the negative electrode of the power generation element outside of the power generation element.

8. The method for controlling a secondary battery according to claim 6, wherein
the electrical insulation member includes a first electrical insulation member and a second electrical insulation member,
the electroconductive member includes a first electroconductive member disposed on a first outward side of the power generation element in the direction in which the unit cell layer is stacked with the first electrical insulation member interposed between the first electroconductive member and the power generation element, and a second electroconductive member disposed on a second outward side of the power generation element in the direction in which the unit cell layer is stacked with the second electrical insulation member interposed between the second electroconductive member and the power generation element;
the external short circuit includes a first external short circuit that electrically connects the first electroconductive member and the electrode having the opposite polarity to that of the electrode in the outermost layer where the first electroconductive member is disposed, and a second external short circuit that electrically connects the second electroconductive member and the electrode having the opposite polarity to that of the electrode in the outermost layer where the second electroconductive member is disposed; and
the external discharge safety circuit actuates the opening-closing device to short-circuit the path between the positive electrode of the power generation element and the negative electrode of the power generation element when the current sensor has detected current flow to at least either one of the first external short circuit and the second external short circuit.

* * * * *